US012777701B2

(12) United States Patent
Kim et al.

(10) Patent No.: US 12,777,701 B2
(45) Date of Patent: Oct. 27, 2026

(54) SEMICONDUCTOR DEVICES

(71) Applicant: Samsung Electronics Co., Ltd., Suwon-si (KR)

(72) Inventors: Gyeom Kim, Suwon-si (KR); Jinbum Kim, Suwon-si (KR); Sangmoon Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 401 days.

(21) Appl. No.: 18/535,421

(22) Filed: Dec. 11, 2023

(65) Prior Publication Data

US 2024/0282830 A1 Aug. 22, 2024

(30) Foreign Application Priority Data

Feb. 20, 2023 (KR) ........................ 10-2023-0021999

(51) Int. Cl.
*H10D 64/23* (2025.01)
*H10D 30/67* (2025.01)
*H10D 62/10* (2025.01)

(52) U.S. Cl.
CPC ....... *H10D 64/256* (2025.01); *H10D 30/6735* (2025.01); *H10D 62/121* (2025.01); *H10D 64/254* (2025.01)

(58) Field of Classification Search
CPC .. H10D 64/256; H10D 64/254; H10D 62/121; H10D 30/6735
See application file for complete search history.

(56) References Cited

U.S. PATENT DOCUMENTS

| | | | |
|---|---|---|---|
| 2021/0336019 A1 | 10/2021 | Su et al. |
| 2021/0376093 A1 | 12/2021 | Chu et al. |
| 2021/0408249 A1 | 12/2021 | Yu et al. |
| 2022/0028994 A1 | 1/2022 | Chen et al. |
| 2022/0052157 A1 | 2/2022 | Chang et al. |

(Continued)

FOREIGN PATENT DOCUMENTS

| | | |
|---|---|---|
| KR | 10-2021-0134215 A | 11/2021 |
| KR | 10-2021-0137372 A | 11/2021 |

(Continued)

OTHER PUBLICATIONS

Korean Office Action corresponding to Korean Application No. 10-2023-0021999, dated Feb. 28, 2026.

*Primary Examiner* — Peter M Albrecht
(74) *Attorney, Agent, or Firm* — HARNESS, DICKEY & PIERCE, P.L.C.

(57) ABSTRACT

A semiconductor device includes a substrate insulating layer; a gate structure extending in one direction on the substrate insulating layer; a source/drain region outside of the gate structure; and a backside contact plug below the source/drain region to have a second central axis offset from a first central axis of the source/drain region in a horizontal direction, and connected to the source/drain region, wherein the source/drain region includes a first epitaxial layer including a non-silicon element in a first concentration, and a second epitaxial layer on the first epitaxial layer and including a non-silicon element in a second concentration, higher than the first concentration, and at least a portion of an upper surface of the backside contact plug is in contact with the second epitaxial layer.

14 Claims, 26 Drawing Sheets

100

(56) References Cited

U.S. PATENT DOCUMENTS

| | | | | |
|---|---|---|---|---|
| 2022/0069076 | A1 | 3/2022 | Yu et al. | |
| 2022/0069117 | A1 | 3/2022 | Yu et al. | |
| 2022/0139911 | A1 | 5/2022 | Wei et al. | |
| 2024/0030136 | A1* | 1/2024 | Chang | H10D 30/6735 |
| 2024/0113193 | A1* | 4/2024 | Li | H10D 30/6735 |

FOREIGN PATENT DOCUMENTS

| | | | |
|---|---|---|---|
| KR | 10-2021-0138468 | A | 11/2021 |
| KR | 10-2022-0029302 | A | 3/2022 |

* cited by examiner

SEMICONDUCTOR DEVICES

CROSS-REFERENCE TO RELATED APPLICATIONS

This application claims benefit of priority to Korean Patent Application No. 10-2023-0021999 filed on Feb. 20, 2023 in the Korean Intellectual Property Office, the disclosure of which is incorporated herein by reference in its entirety.

BACKGROUND

Various example embodiments relate to a semiconductor device.

As demands or expectations for high performance, high speed, and/or multifunctionality of semiconductor devices increase, degrees of integration of semiconductor devices are increasing. According to the trend for high degrees of integration of semiconductor devices, semiconductor devices having a back side power delivery network (BSPDN) structure in which a power rail is disposed on a backside of a wafer or substrate or chip are being developed. Alternatively or additionally, in order to overcome or partially overcome the limitations of operating characteristics due to a decrease in size of a planar metal oxide semiconductor FET (MOSFET), efforts are being made to develop semiconductor devices including FinFETs having a three-dimensional structure channel.

SUMMARY

Various example embodiments may provide a semiconductor device having improved reliability.

According to some example embodiments, a semiconductor device includes a substrate insulating layer, a gate structure extending in one direction on the substrate insulating layer, a source/drain region outside of the gate structure, and a backside contact plug below the source/drain region and having a second central axis offset in a horizontal direction from a first central axis of the source/drain region, and connected to the source/drain region. The source/drain region includes a first epitaxial layer and a second epitaxial layer the first epitaxial layer including a first non-silicon element at a first concentration, and the second epitaxial layer on the first epitaxial layer and including a second non-silicon element at a second concentration, greater than the first concentration. At least a portion of an upper surface of the backside contact plug is in contact with the second epitaxial layer.

Alternatively or additionally according to some example embodiments, a semiconductor device includes a gate structure extending in one direction, a source/drain region outside of the gate structure, and a backside contact plug below the source/drain region, having a second central axis offset in a horizontal direction from a first central axis of the source/drain region, and connected to the source/drain region. The backside contact plug includes a vertical region and a contact region, the vertical region extending vertically and having a first width, and the contact region on the vertical region and having a second width, wider than the first width.

Alternatively or additionally according to some example embodiments, a semiconductor device includes a gate structure extending in one direction, a source/drain region outside of the gate structure, and a backside contact plug below the source/drain region and connected to the source/drain region. The backside contact plug includes a vertical region and a contact region, the vertical region extending vertically and having a first width, and the contact region on the vertical region and having a second width, wider than the first width. A second central axis of the vertical region is offset in a horizontal direction from a first central axis of the contact region.

BRIEF DESCRIPTION OF DRAWINGS

The above and other aspects, features, and advantages of inventive concepts will be more clearly understood from the following detailed description, taken in conjunction with the accompanying drawings, in which.

DETAILED DESCRIPTION

Figure 1:
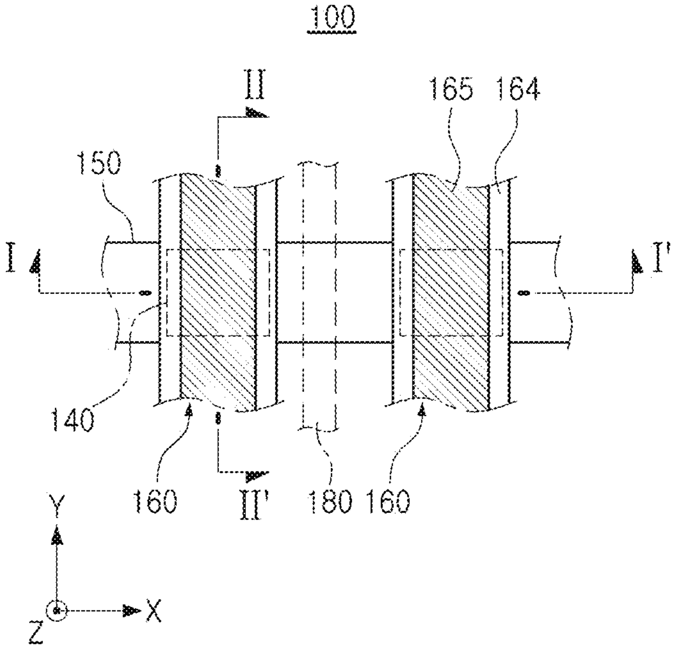
FIG. 1 is a schematic plan view illustrating a semiconductor device according to some example embodiments.

Hereinafter, some example embodiments of inventive concepts will be described with reference to the accompanying drawings. Hereinafter, it can be understood that terms such as 'on,' 'upper portion,' 'upper surface,' 'below,' 'lower portion,' 'lower surface,' 'side surface,' and the like may be indicated by reference numerals and may be based on drawings, unless otherwise indicated.

FIG. 1 is a schematic plan view illustrating a semiconductor device according to some example embodiments.

Figure 2:
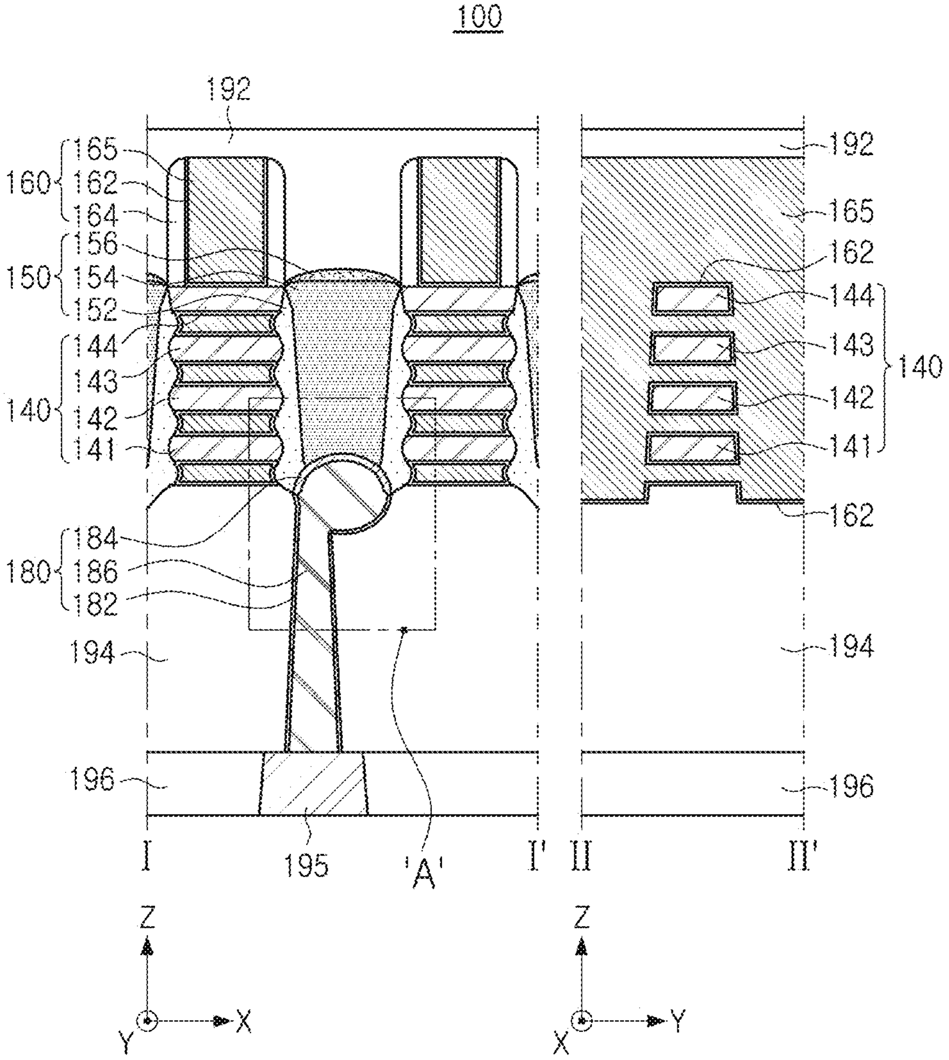
FIG. 2 is a schematic cross-sectional view illustrating a semiconductor device according to some example embodiments.

FIG. 2 is a schematic cross-sectional view illustrating a semiconductor device according to some example embodiments. FIG. 2 illustrates cross-sections of the semiconductor device of FIG. 1, taken along lines I-I' and II-II'. For convenience of explanation, only some components of the semiconductor device may be illustrated in FIG. 1.

Figure 3:
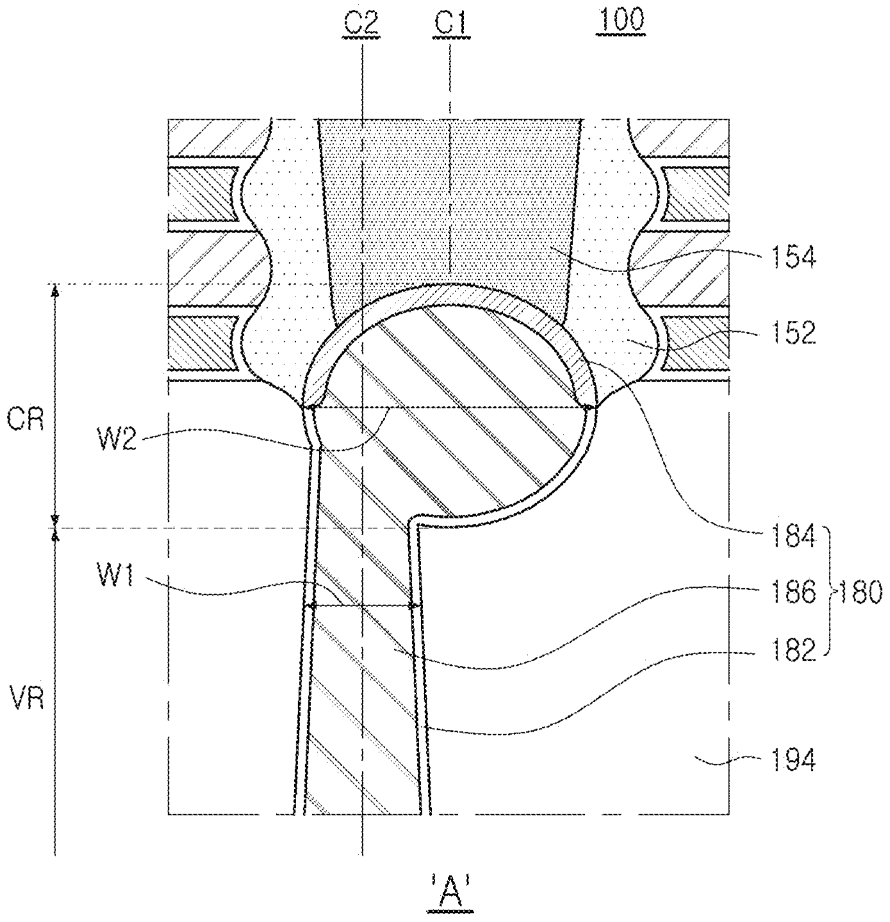
FIG. 3 is a schematic partial enlarged view illustrating a semiconductor device according to some example embodiments.

FIG. 3 is a schematic partial enlarged view illustrating a semiconductor device according to some example embodiments. FIG. 3 is an enlarged view of portion 'A' of FIG. 2.

Referring to FIGS. 1 to 3, a semiconductor device 100 may include a substrate insulating layer 194, gate structures 160 extending in one direction on the substrate insulating layer 194 and respectively including a gate electrode 165, channel structures 140 respectively including a number such as four such as first to fourth channel layers 141, 142, 143, and 144 disposed vertically spaced apart from each other on the substrate insulating layer 194, source/drain regions 150 contacting the channel structures 140, a backside contact plug 180 passing through the substrate insulating layer 194 and connected to the source/drain regions 150, and a backside power structure 195 connected to the backside contact plug 180. The semiconductor device 100 may further include first and second interlayer insulating layers 192 and 196.

The substrate insulating layer 194 may have an upper surface extending in an X-direction and a Y-direction. The substrate insulating layer 194 may be a layer formed by removing and/or oxidizing such as thermally oxidizing a substrate 101 (see FIG. 9A) formed of a semiconductor material during a manufacturing process. The substrate insulating layer 194 may be formed of an insulating material, and may include, for example, an oxide, a nitride, or a combination thereof; example embodiments are not limited thereto. According to various example embodiments, the substrate insulating layer 194 may include a plurality of insulating layers.

The gate structures 160 may be disposed on the substrate insulating layer 194 to extend in the one direction, for example, in the Y-direction. Channel regions of transistors may be formed in the channel structures 140 crossing the gate electrode 165 of the gate structures 160. The gate structures 160 may be spaced apart from each other in the X-direction. Each of the gate structures 160 may include gate dielectric layers 162, gate spacer layers 164, and a gate electrode 165. In some example embodiments, each of the gate structures 160 may further include a capping layer (not illustrated) on an upper surface of the gate electrode 165.

The gate dielectric layers 162 may be disposed between the substrate insulating layer 194 and the gate electrode 165 and between the channel structures 140 and the gate electrode 165, and may be arranged to cover at least a portion of surfaces of the gate electrode 165. For example, the gate dielectric layers 162 may be disposed to surround entirely surfaces except for an uppermost surface of the gate electrode 165. The gate dielectric layers 162 may extend between the gate electrode 165 and the gate spacer layers 164, but are not limited thereto. The gate dielectric layer 162 may include an oxide, a nitride, or a high-κ material. The high-κ material may mean a dielectric material having a higher dielectric constant than a silicon oxide ($SiO_2$). The high-κ material may be, for example, any one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), or praseodymium oxide ($Pr_2O_3$). According to some example embodiments, the gate dielectric layer 162 may be provided as a multilayer structure.

The gate electrode 165 may include a conductive material, and may include, for example, at least one of a metal nitride such as titanium nitride (TiN), tantalum nitride (TaN), or tungsten nitride (WN), and/or a metal material such as aluminum (Al), tungsten (W), molybdenum (Mo), or the like, or a semiconductor material such as doped polysilicon. According to various example embodiments, the gate electrode 165 may be provided as a multilayer structure. In a region not illustrated, the gate electrodes 165 may be connected to upper contact plugs disposed thereon.

The gate spacer layers 164 may be disposed on both side surfaces of the gate electrode 165 on the channel structure 140. The gate spacer layers 164 may insulate the source/drain regions 150 and the gate electrodes 165. Depending on example embodiments, shapes of upper ends of the gate spacer layers 164 may be variously changed, and the gate spacer layers 164 may be provided as a multilayer structure. The gate spacer layers 164 may include at least one of an oxide, a nitride, or an oxynitride, and may be provided as, for example, a low-κ film.

The channel structures 140 may be disposed on the substrate insulating layer 194 to cross the gate structures 160. Each of the channel structures 140 may include the first to fourth channel layers 141, 142, 143, and 144 that may be two or more channel layers spaced apart from each other in a Z-direction. Although four channel structures are illustrated, example embodiments are not limited thereto. The channel structures 140 may be connected to the source/drain regions 150. Each of the channel structures 140 may have a width, equal to or similar to a width of each of the gate structures 160 in the X-direction. In a cross-section in the Y-direction, a lower channel layer may have a width, equal to or wider than a width of an upper channel layer, among the first to fourth channel layers 141, 142, 143, and 144. In some example embodiments, the channel structures 140 may have a decrease in width, as compared to the gate structures 160, such that side surfaces thereof are located below the gate structures 160 in the X-direction.

The channel structures 140 may be formed of or may include a semiconductor material, and may include, for example, at least one of silicon (Si), silicon germanium (SiGe), or germanium (Ge), which may be in single-crystalline phase and/or in polycrystalline phase. The number and/or the shapes of channel layers included in one channel structure 140 may be variously changed in various example embodiments.

In the semiconductor device 100, the gate electrode 165 may be disposed between the first to fourth channel layers 141, 142, 143, and 144 of the channel structures 140, and on the channel structures 140. Therefore, the semiconductor device 100 may include a multi bridge channel FET (MBCFET™) transistor, which may be or may include or be included in a gate-all-around type field effect transistor.

The source/drain regions 150 may be disposed on first and second (or both) sides of the gate structures 160 to contact the channel structures 140, respectively. The source/drain region 150 may be disposed to cover side surfaces of each of the first to fourth channel layers 141, 142, 143, and 144 of the channel structure 140 in the X-direction. At least one of the source/drain regions 150 may be connected to the backside contact plug 180 through a lower surface and/or a lower end of the source/drain region 150. A lower region of the source/drain region 150 may have a shape recessed by the backside contact plug 180. The source/drain region 150 may be electrically connected to the backside power structure 195 through the backside contact plug 180, so as to receive power. An upper surface of the source/drain region 150 may be located on a height, equal to or similar to a lower surface of the gate electrode 165 on the channel structure 140, and the height may be variously changed in different example embodiments.

The source/drain region 150 may include a number of epitaxial layers such as first to third epitaxial layers 152, 154, and 156, sequentially arranged from the bottom. The first epitaxial layers 152 may cover side surfaces of each of the first to fourth channel layers 141, 142, 143, and 144 in the X-direction, and may cover side surfaces of the gate structures 160 below the channel structure 140 in the X-direction. The first epitaxial layers 152 may cover an internal side surface of a recess region in which the source/drain region 150 is disposed, and may be arranged to be spaced apart from each other in one source/drain region 150 by the backside contact plug 180 in the X-direction. The first epitaxial layers 152 may have external side surfaces convexly protruding toward the gate structures 160 below the channel structures 140, and thus may have a curvature on the external side surfaces. Some of surfaces in lower regions of the first epitaxial layers 152 may be in contact with the backside contact plug 180, and may have a curved shape (e.g., a concave-curved shape) along the backside contact plug 180.

The second epitaxial layer 154 may cover the first epitaxial layer 152, and may fill the recess region. A lower surface of the second epitaxial layer 154 may be in contact with the backside contact plug 180, and may have a curved surface (e.g., a concave-curved surface) along the backside contact plug 180. A width of the second epitaxial layer 154 between the first epitaxial layers 152 in the X-direction may be greater than a thickness of the first epitaxial layer 152 on one side surface of the channel structure 140. The third epitaxial layer 156 may be disposed on an upper surface of the second epitaxial layer 154. The third epitaxial layer 156 may have a thickness, thinner than the thickness of the first epitaxial layer 152. The third epitaxial layer 156 may have a curved profile (e.g., a concave-curved profile).

The source/drain regions 150 may include a semiconductor material, for example, at least one of silicon (Si) or germanium (Ge), and may further include impurities such as but not limited to at least one of boron, carbon, arsenic, or phosphorus. The first to third epitaxial layers 152, 154, and 156 may have different compositions. A concentration of a non-silicon element in the second epitaxial layer 154 may be higher than or greater than a concentration of a non-silicon element in the first epitaxial layer 152. The non-silicon element may be, for example, germanium (Ge) and/or a doping element, and may or may not be the same non-silicon element in the first to third epitaxial layers 152, 154, 156. The first to third epitaxial layers 152, 154, 156 may not have a seem or an interface therebetween.

The second epitaxial layer 154 may have a doping concentration, greater than a doping concentration of the first epitaxial layer 152. Therefore, a resistivity of the second epitaxial layer 154 may be lower than a resistivity of the first epitaxial layer 152. When the semiconductor device 100 is a pFET, the impurities may be at least one of boron (B), gallium (Ga), or indium (In), and when the semiconductor device 100 is an nFET, the impurities may be at least one of phosphorus (P), arsenic (As), or antimony (Sb). For example, a boron (B) concentration of the first epitaxial layer 152 may range from about $1\times10^{16}/cm^3$ to about $1\times10^{21}/cm^3$, and a boron (B) concentration of the second epitaxial layer 156 may range from about $1\times10^{19}/cm^3$ to about $1\times10^{22}/cm^3$.

In some example embodiments, when the semiconductor device 100 is a pFET, there may or may not be N-type impurities included therein at a doping concentration much less than a doping concentration of P-type impurities. Additionally or alternatively, in some example embodiments, when the semiconductor device 100 is an nFET, there may or may not be P-type impurities included therein at a doping concentration much less than a doping concentration of N-type impurities. Example embodiments are not limited thereto.

In some example embodiments, for example, when the semiconductor device 100 is a pFET, the source/drain regions 150 may include silicon germanium (SiGe), and a germanium (Ge) concentration of the second epitaxial layer 154 may be higher than a germanium (Ge) concentration of the first epitaxial layer 152. A germanium (Ge) concentration of the third epitaxial layer 156 may be lower than the germanium (Ge) concentration of the second epitaxial layer 154, but may not be limited thereto. For example, the germanium (Ge) concentration of the first epitaxial layer 152 may range from about 1 at % to about 20 at %, the germanium (Ge) concentration of the second epitaxial layer 154 may range from about 30 at % to about 70 at %, and the germanium (Ge) concentration of the third epitaxial layer 156 may range from about 0 at % to about 40 at %. In some example embodiments, when the semiconductor device 100 is an nFET, the source/drain regions 150 may or may not include SiGe.

The backside contact plug 180 may be disposed below the source/drain regions 150. The backside contact plug 180 may pass through the substrate insulating layer 194, and may be connected to the source/drain region 150. The backside contact plug 180 may be disposed to contact a recessed lower surface of the source/drain region 150 by partially recessing a lower region of the source/drain region 150. An upper surface of the backside contact plug 180 may be in contact with both the first and second epitaxial layers 152 and 154 of the source/drain region 150. A level of an upper end of the backside contact plug 180 may be higher than or above a level of a lower end of the source/drain region 150.

As illustrated in FIG. 3, the backside contact plug 180 may include a vertical region VR extending vertically, and a contact region CR disposed on the vertical region VR and having an expanded (or rounded) shape. The vertical region VR may extend vertically while passing through the substrate insulating layer 194, and may have a side surface inclined to decrease a width toward the source/drain region 150. The vertical region VR may be located below the source/drain region 150. The contact region CR may include a region passing through the first epitaxial layer 152 and contacting the source/drain region 150. A portion of a surface of the contact region CR may be in contact with the first epitaxial layer 152, and a portion of the surface of the contact region CR may be in contact with the second epitaxial layer 154. A level of a lower end of the contact region CR may be lower than or below a level of a lower end of the source/drain region 150. The vertical region VR may have a first width W1, and the contact region CR may have a diameter or a second width W2, wider than the first width W1. A width of the vertical region VR may decrease in an upward direction (e.g., may taper in an upward direction), and the first width W1 may be a width in a region adjacent to the contact region CR or on an upper end of the vertical region VR.

As illustrated in FIG. 3, a first central axis C1 of the source/drain region 150 and a second central axis C2 of the backside contact plug 180 may not coincide with each other, and may be, for example, horizontally offset in the X-direction. A horizontal distance between the first central axis C1 and the second central axis C2 may be, for example, in a range of about 0.5 nm to about 20 nm. The second central axis C2 may be a central axis of the vertical region VR. The central axis of the vertical region VR may be horizontally offset from a central axis of the contact region CR in the X-direction. The central axis of the contact region CR may be identical to or different from the first central axis C1, and may be closer to the first central axis C1 than the central axis of the vertical region VR.

The backside contact plug 180 may include a liner layer 182, a silicide layer such as metal-semiconductor compound layer 184, and a conductive layer 186. The liner layer 182 may form an external side surface of the vertical region VR, and may form a portion of a surface of the contact region CR. The liner layer 182 may be located on an interface with the substrate insulating layer 194. However, an extension range of the liner layer 182 may be variously changed in embodiments, and in some embodiments, the liner layer 182 may not extend into the contact region CR. The liner layer 182 may include, for example, a metal nitride such as titanium nitride (TiN), tantalum nitride (TaN), or tungsten nitride (WN).

The metal-semiconductor compound layer 184 may be located on the upper end of the backside contact plug 180, and may form at least a portion of the upper surface of the backside contact plug 180. The metal-semiconductor compound layer 184 may be located on a surface contacting the source/drain region 150 in the contact region CR. The metal-semiconductor compound layer 184 may be disposed at least in a region in which the backside contact plug 180 is in contact with the second epitaxial layer 154. In some example embodiments, a range of the metal-semiconductor compound layer 184 is not limited to that illustrated. The metal-semiconductor compound layer 184 may be, for example, a metal silicide layer. The conductive layer 186 may be disposed to fill a contact hole surrounded by the liner layer 182 and the metal-semiconductor compound layer 184. The conductive layer 186 may include, for example, a metal material such as one or more of aluminum (Al), tungsten (W), molybdenum (Mo), or the like. In some example embodiments, the number and/or the arrangement of conductive layers constituting the backside contact plug 180 may be variously changed. In some example embodiments, the liner layer 182 and/or the metal-semiconductor compound layer 184 may be omitted.

In various example embodiments, when the vertical region VR is misaligned with the source/drain region 150, e.g., even when the vertical region VR is offset, the contact region CR may have a wider width than the vertical region VR and may be arranged to have a central axis identical to or adjacent to the first central axis C1, to be stably or more stably connected to the source/drain region 150. Alternatively or additionally, a contact area between the metal-semiconductor compound layer 184 and the second epitaxial layer 154 of the source/drain region 150 may be secured or more like secured to reduce minimize contact resistance.

The backside power structure 195 may be connected to a lower end or a lower surface of the backside contact plug 180. The backside power structure 195, together with the backside contact plug 180, may form a BSPDN that applies or is configured to apply power or ground voltage, and may also be referred to as a backside power rail or a buried power rail. For example, the backside power structure 195 may be or may include or be included in a buried interconnection line extending in one direction, for example, in the Y-direction below the backside contact plug 180, but a shape of the backside power structure 195 is not limited thereto. For example, in some example embodiments, the backside power structure 195 may include a via region and/or a line region. A width of the backside power structure 195 may continuously increase in a downward direction, but is not limited thereto.

The backside power structure 195 may be disposed such that a central axis of the backside power structure 195 coincides with the second central axis C2. However, in some embodiments, the central axis of the backside power structure 195 and the second central axis C2 may not coincide. For example, based on the vertical region VR of the backside contact plug 180, the source/drain region 150 and the backside power structure 195 may be offset in the same direction.

The backside power structure 195 may include a conductive material, such as at least one of tungsten (W), copper (Cu), aluminum (Al), cobalt (Co), ruthenium (Ru), titanium (Ti), or molybdenum (Mo).

The first interlayer insulating layer 192 may be disposed to cover upper surfaces of the source/drain regions 150 and upper surfaces of the gate structures 160. The second interlayer insulating layer 196 may be disposed to cover a lower surface of the substrate insulating layer 194 and to surround the backside power structure 195.

The first and second interlayer insulating layers 192 and 196 may include at least one of an oxide, a nitride, or an oxynitride, and may include, for example, a low-κ material. According to some example embodiments, each of the first and second interlayer insulating layers 192 and 196 may include a plurality of insulating layers.

The semiconductor device 100 may be packaged by inverting the structure of FIG. 2 such that the backside power structure 195 is located in an upper portion, but a packaging form or structure of the semiconductor device 100 is not limited thereto. Since the source/drain regions 150 may be connected to the backside power structure 195 through the backside contact plug 180, integration may be improved. Alternatively or additionally, since a contact region between the backside contact plug 180 and the source/drain area 150 may be secured by the contact region CR of the backside contact plug 180, contact resistance may be minimized or reduced, and/or reliability may be improved.

In the description of the following example embodiments, descriptions overlapping those described above with reference to FIGS. 1 to 3 will be omitted.

Figure 4A:
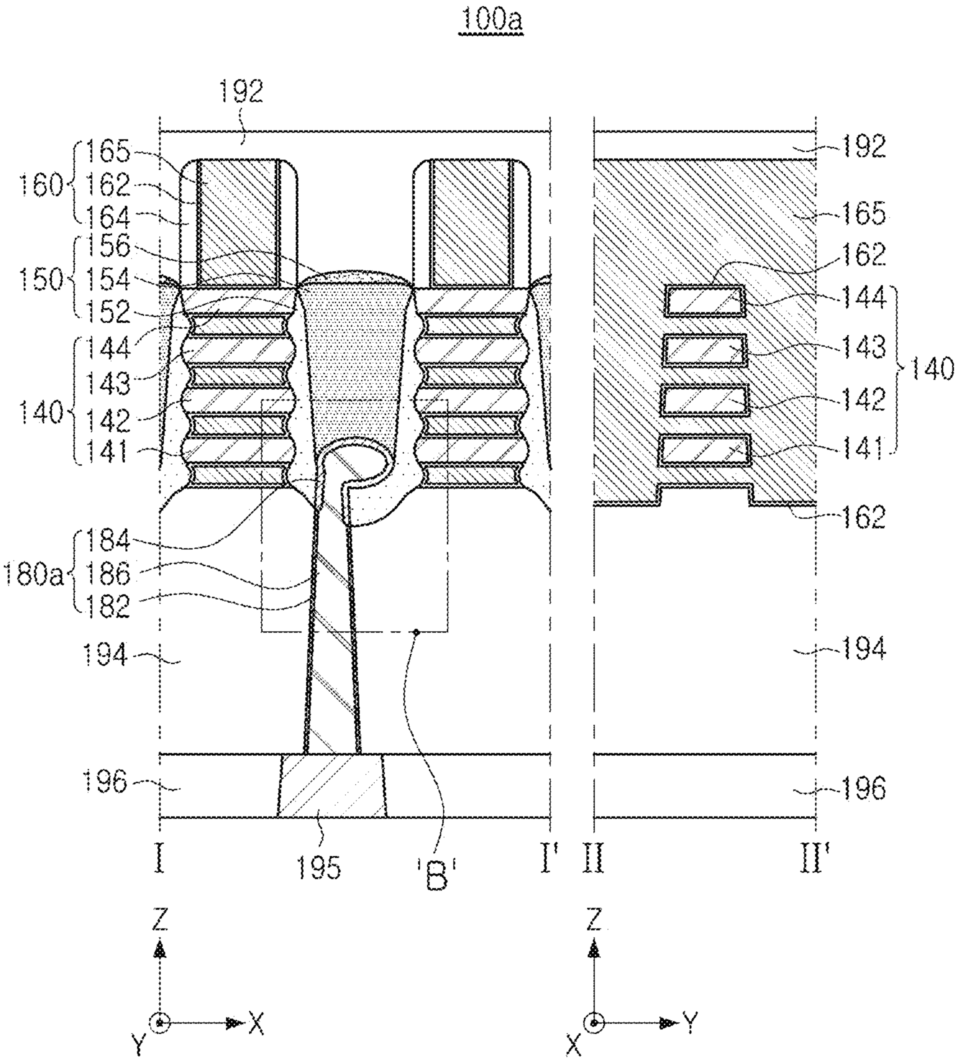
FIGS. 4A and 4B are a schematic cross-sectional view and a partially enlarged view of a semiconductor device according to some example embodiments, respectively.
Figure 4B:
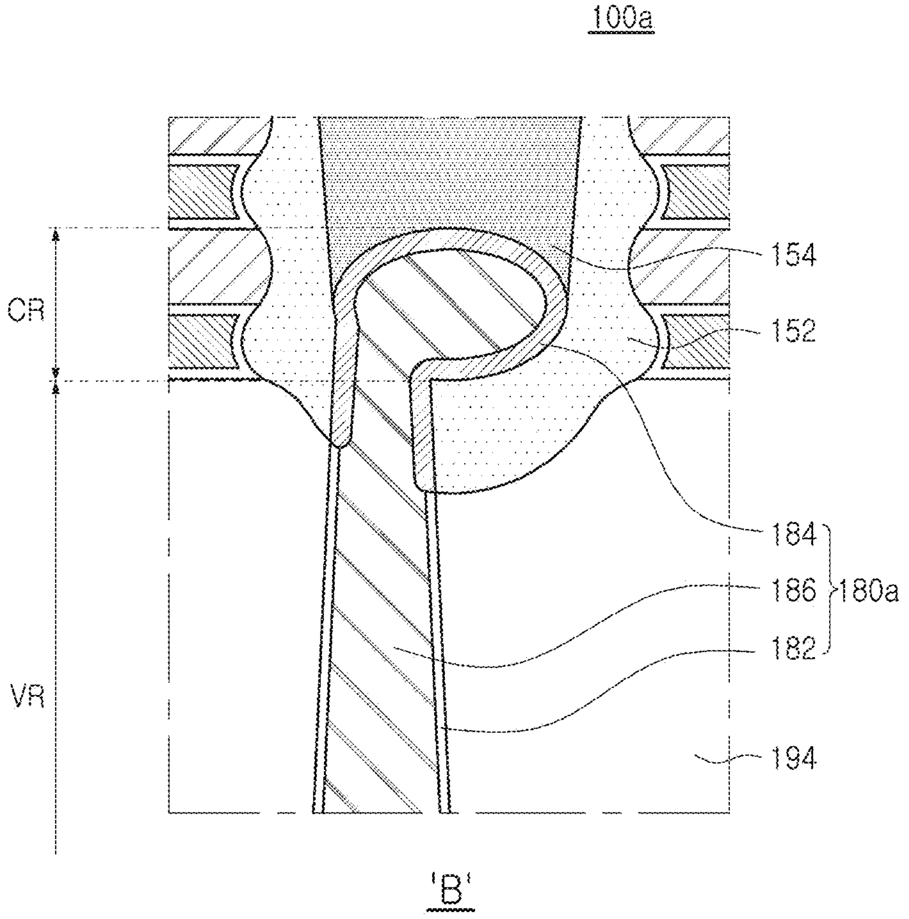

FIGS. 4A and 4B are a schematic cross-sectional view and a partially enlarged view of a semiconductor device according to some example embodiments, respectively. FIG. 4A illustrates a region corresponding to FIG. 2, and FIG. 4B is an enlarged view of portion 'B' of FIG. 4A.

Referring to FIGS. 4A and 4B, a backside contact plug 180*a* of a semiconductor device 100*a* may have a shape, different from a shape of the embodiment of FIGS. 2 and 3, and accordingly, a shape of a source/drain region 150 may also be different therefrom.

The backside contact plug 180*a* may be disposed to pass through a first epitaxial layer 152 in a lower region of the source/drain region 150. Specifically, a vertical region VR may pass through a substrate insulating layer 194 and the first epitaxial layer 152, and may extend vertically, and a contact region CR may be in contact with a second epitaxial layer 154 through an upper surface of the contact region CR. Also, in some example embodiments, a width of the contact region CR may be wider than a width of at least an upper region of the vertical region VR.

In the contact region CR, a portion of a surface including an upper end may be in contact with the second epitaxial layer 154, and a portion of the surface may be in contact with the first epitaxial layer 152. A level of a lower end of the contact region CR may be higher than a level of a lower end of the source/drain region 150. In the vertical region VR, a portion of a side surface of an upper region may be in contact with the first epitaxial layer 152. As illustrated in FIG. 4B, a metal-semiconductor compound layer 184 may extend into the vertical region VR, and may be further located on a surface on which the vertical region VR contacts the source/drain region 150.

Figure 5A:
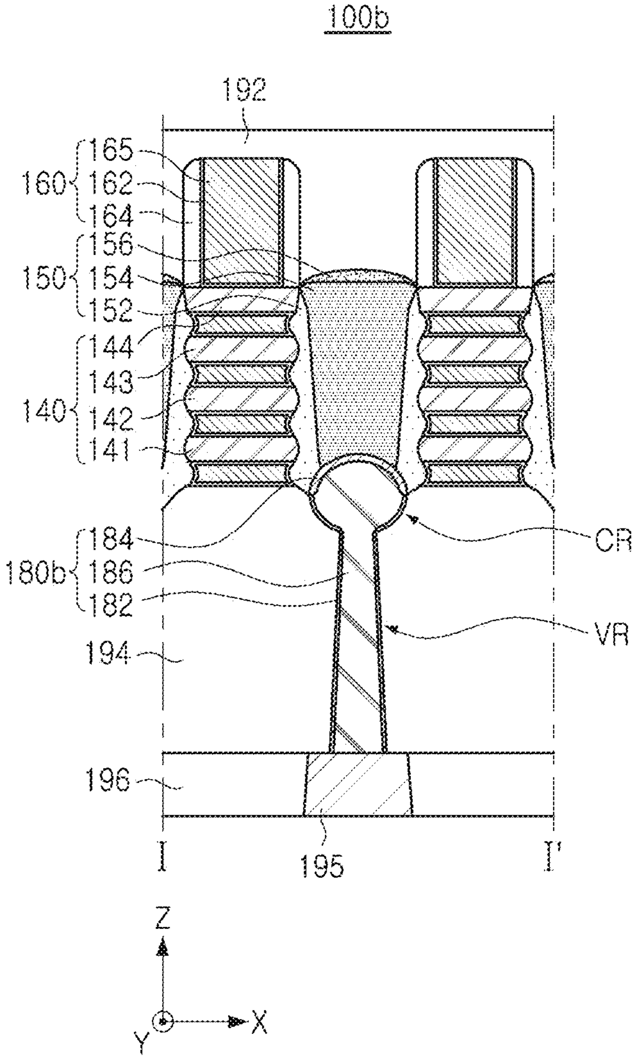
FIGS. 5A and 5B are schematic cross-sectional views illustrating a semiconductor device according to some example embodiments.
Figure 5B:
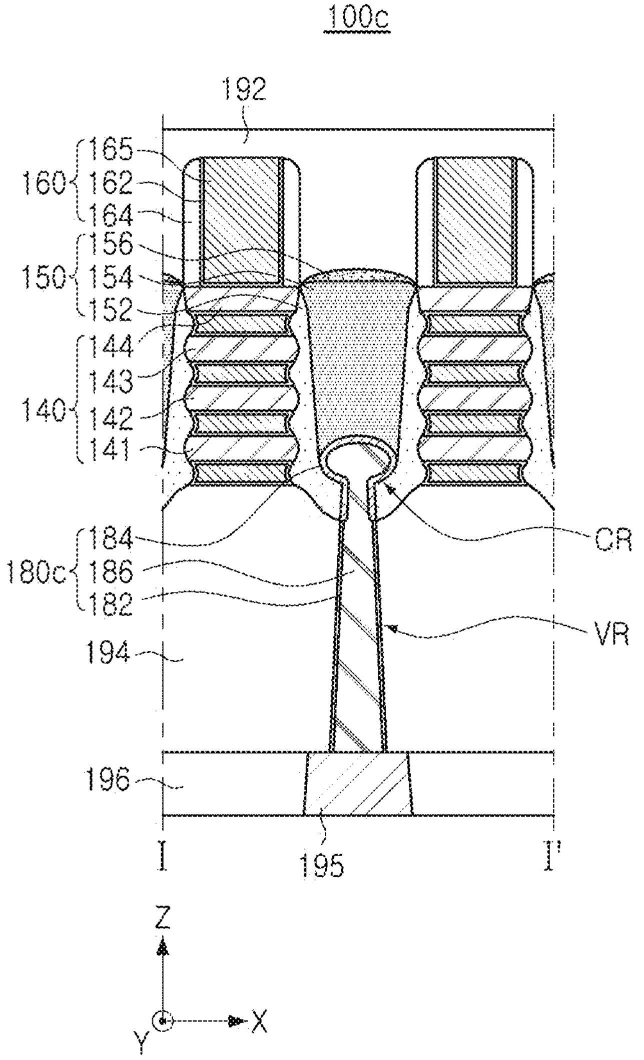

FIGS. 5A and 5B are schematic cross-sectional views illustrating a semiconductor device according to some example embodiments. FIGS. 5A and 5B illustrate regions corresponding to the cross-sections of FIGS. 2 and 4A, respectively, taken along line I-I'.

Referring to FIG. 5A, in a semiconductor device 100*b*, arrangement between a source/drain region 150 and a backside contact plug 180*b* may be different from that of the embodiment of FIGS. 2 and 3.

In some example embodiments, a central axis of the backside contact plug 180*b* may coincide with a central axis of the source/drain region 150. For example, the backside contact plug 180*b* may be accurately aligned with the source/drain region 150. In the backside contact plug 180*b*, a central axis of a vertical region VR and a central axis of a contact region CR may also coincide with each other. Since the contact region CR may expand to have a width, wider than a width of the vertical region VR, and may be in contact with the source/drain region 150 through a portion of an upper surface, contact resistance may be reduced.

Referring to FIG. 5B, arrangement between a source/drain region 150 and a backside contact plug 180*c* in a semiconductor device 100*c* may be different from that of the embodiment of FIGS. 4A and 4B.

In some example embodiments, a central axis of the backside contact plug 180*c* may coincide with a central axis of the source/drain region 150. For example, the backside contact plug 180*c* may be accurately aligned with the source/drain region 150. In the backside contact plug 180*c*, a central axis of a vertical region VR and a central axis of a contact region CR may also coincide with each other. Since the contact region CR may expand to have a width, wider than a width of at least an upper end of the vertical region VR, and may be in contact with the source/drain region 150 through an external surface, contact resistance may be reduced.

Figure 6A:
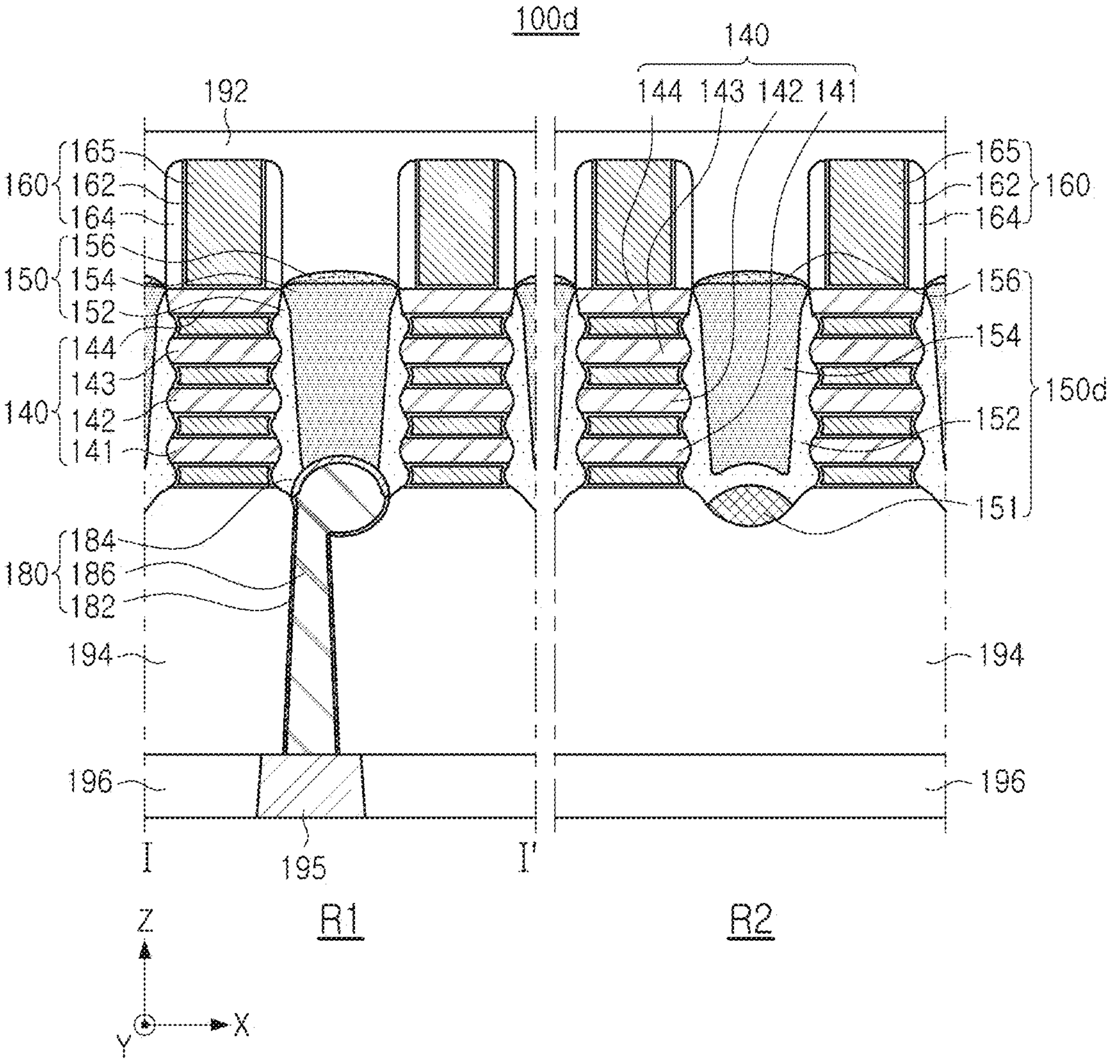
FIGS. 6A and 6B are schematic cross-sectional views illustrating a semiconductor device according to some example embodiments.
Figure 6B:
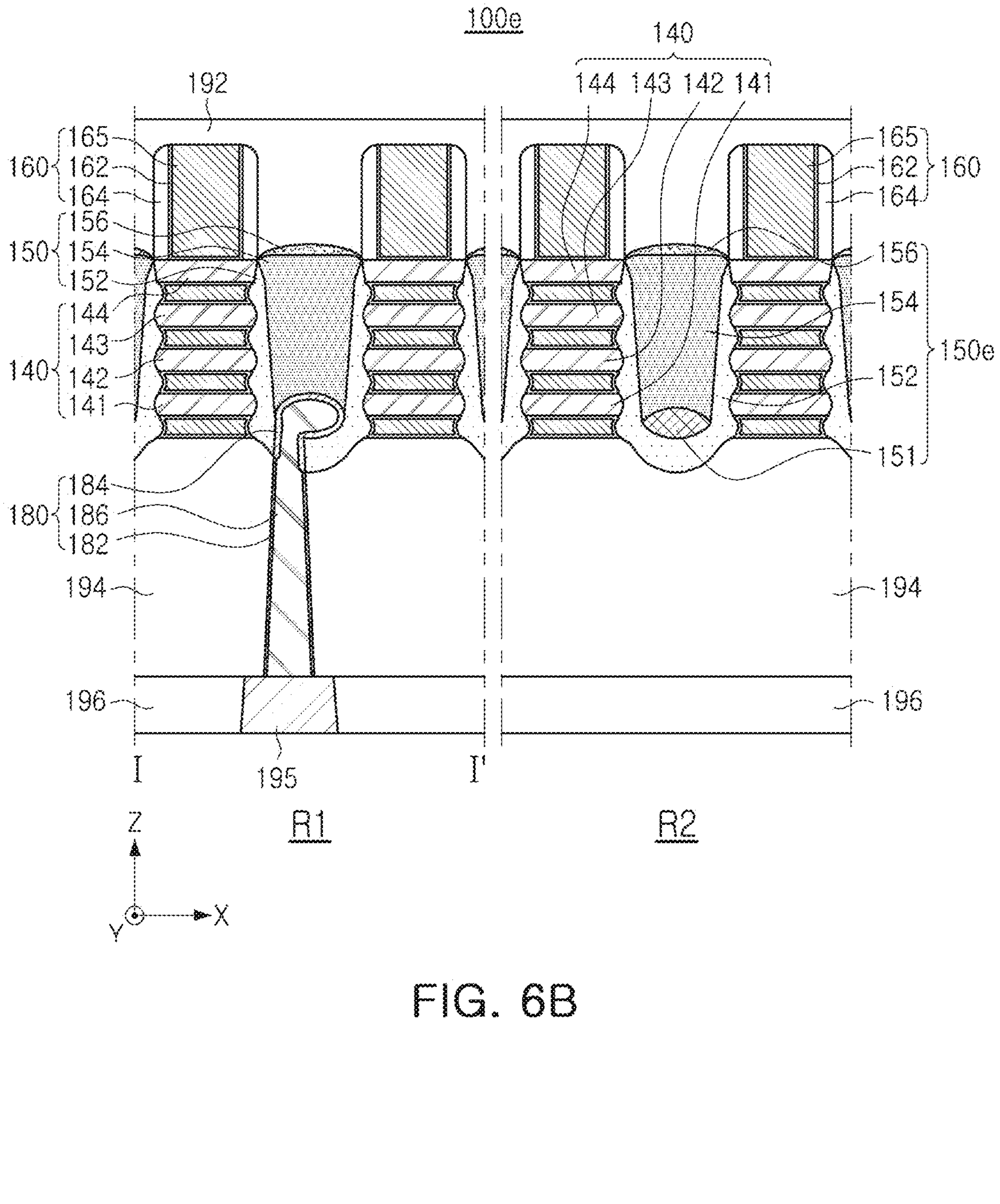

FIGS. 6A and 6B are schematic cross-sectional views illustrating a semiconductor device according to some example embodiments.

Referring to FIG. 6A, a semiconductor device 100*d* may include first and second regions R1 and R2. The semiconductor device described above with reference to FIGS. 1 to 3 may be disposed in the first region R1. The second region R2 may be adjacent to or spaced apart from the first region R1. Unlike a source/drain region 150 in the first region R1, a source/drain region 150*d* in the second region R2 may further include a sacrificial epitaxial layer 151.

The sacrificial epitaxial layer 151 may be disposed on a bottom surface of a recess region in which the source/drain region 150*d* is disposed, and disposed between a substrate insulating layer 194 and a first epitaxial layer 152.

The sacrificial epitaxial layer 151 may have a composition such as a concentration different from that of first to third epitaxial layers 152, 154, and 156. The sacrificial epitaxial layer 151 may include a non-silicon element having a higher concentration than at least the first and second epitaxial layers 152 and 154. For example, when the semiconductor device 100*d* is a pFET, a germanium (Ge) concentration of the sacrificial epitaxial layer 151 may be higher than a germanium (Ge) concentration of each of the first to third epitaxial layers 152, 154, and 156. For example, the germanium (Ge) concentration of the sacrificial epitaxial layer 151 may range from about 50 at % to about 100 at %. In some embodiments, a concentration of impurities in the sacrificial epitaxial layer 151 may be higher than a concentration of impurities in each of the first to third epitaxial layers 152, 154, and 156.

In some example embodiments, the second region R2 may be a dummy region, e.g., a region that is not electrically active or that floats, and in this case, a gate structure 160 and the source/drain region 150*d* of the second region R2 may not constitute a transistor. In some example embodiments, the semiconductor device 100*d* may further include a contact plug disposed on the source/drain region 150*d* and connected to an upper region of the source/drain region 150*d*.

Referring to FIG. 6B, a semiconductor device 100*e* may include first and second regions R1 and R2, as described in FIG. 6A. Unlike a source/drain region 150 in the first region R1, a source/drain region 150*e* in the second region R2 may further include a sacrificial epitaxial layer 151.

In some example embodiments, the sacrificial epitaxial layer 151 may be disposed on a central region of a first epitaxial layer 152, and may be disposed between the first epitaxial layer 152 and a second epitaxial layer 154. In addition, the description of FIG. 6A may be equally applied to description of a material of the sacrificial epitaxial layer 151 and description of the second region R2.

Figure 7:
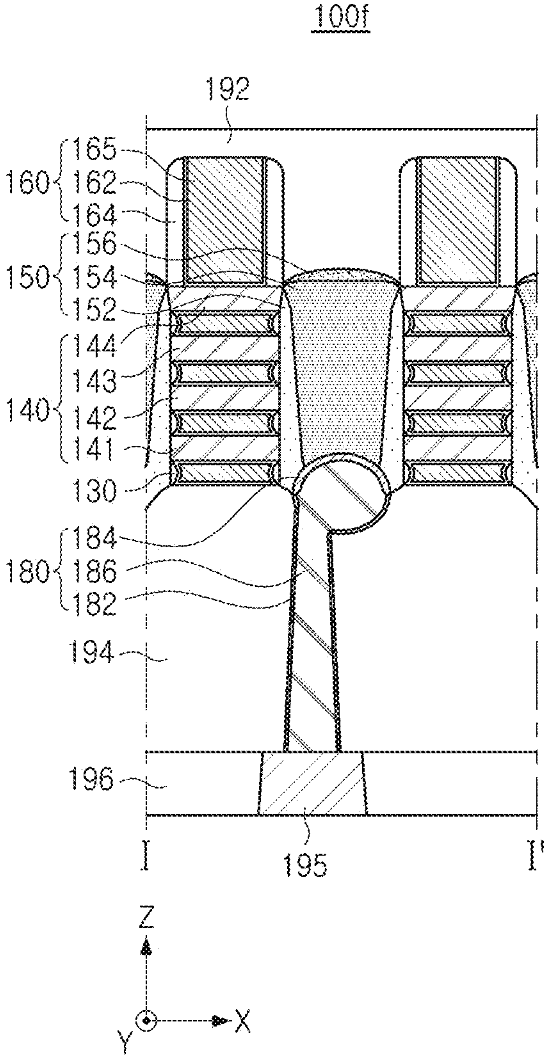
FIG. 7 is a schematic cross-sectional view illustrating a semiconductor device according to some example embodiments.

FIG. 7 is a schematic cross-sectional view illustrating a semiconductor device according to some example embodiments. FIG. 7 illustrates a region corresponding to a cross-section of FIG. 2, taken along line I-I'.

Referring to FIG. 7, a semiconductor device 100*f* may further include internal spacer layers 130 disposed on both side surfaces of a gate structure 160 in the X-direction below a fourth channel layer 144.

The internal spacer layers 130 may be disposed parallel to gate electrodes 165 and gate dielectric layers 162 between first to fourth channel layers 141, 142, 143, and 144 in the Z-direction. The gate electrodes 165 may be stably spaced apart from the source/drain regions 150 by the internal spacer layers 130, and may be electrically separated from each other. Side surfaces of the internal spacer layers 130 facing the gate electrodes 165 may have convexly rounded shapes toward the gate electrodes 165, but are not limited thereto. The internal spacer layers 130 may include at least one of an oxide, a nitride, or an oxynitride, and may be formed of, for example, a low-κ film. In some embodiments, the semiconductor device 100*f* may include a plurality of devices, and the internal spacer layers 130 may be applied to only some of the devices.

Figure 8:
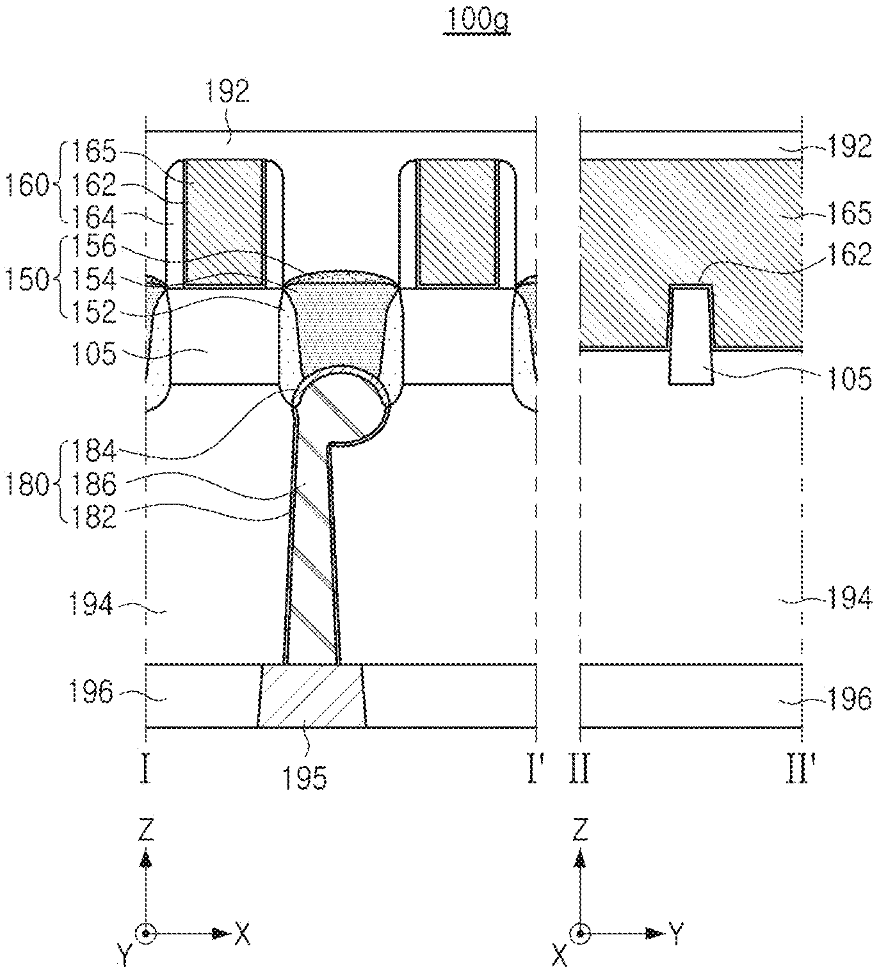
FIG. 8 is a schematic cross-sectional view illustrating a semiconductor device according to some example embodiments.

FIG. 8 is a schematic cross-sectional view illustrating a semiconductor device according to some example embodiments. FIG. 8 illustrates regions corresponding to the regions illustrated in FIG. 2.

Referring to FIG. 8, unlike the embodiment of FIGS. 1 to 3, a semiconductor device 100*g* may not include channel structures 140. Therefore, arrangement of gate structures 160 may be different from the embodiments described above. The semiconductor device 100*g* may include FinFETs that do not include a separate channel layer.

The semiconductor device 100*g* may further include an active region 105 crossing the gate structure 160 and extending in one direction, for example, in the X-direction. The active region 105 may be formed of a semiconductor material, and may further include impurities. On first and second sides of the gate structure 160, the active region 105 may be partially recessed to form recess regions, and source/drain regions 150 may be disposed in the recess regions.

Channel regions of transistors in the semiconductor device 100*g* may be formed in the active region 105. Separate channel layers may not be interposed in gate electrodes 165. Therefore, in the source/drain regions 150, side surfaces of first epitaxial layers 152 may not have curves corresponding to those of the gate structure 160 and the channel layers. Other descriptions of the gate electrodes 165, the source/drain regions 150, and a backside contact plug 180 may be equally applied to descriptions of the embodiment of FIGS. 1 to 3. Such a semiconductor device 100*g* may be additionally disposed in one region of the semiconductor device of other embodiments.

FIGS. 9A to 9L are views illustrating a method of manufacturing or fabricating a semiconductor device according to some example embodiments, in a process sequence. FIGS. 9A to 9L illustrate cross-sections corresponding to FIG. 2.

Figure 9A:
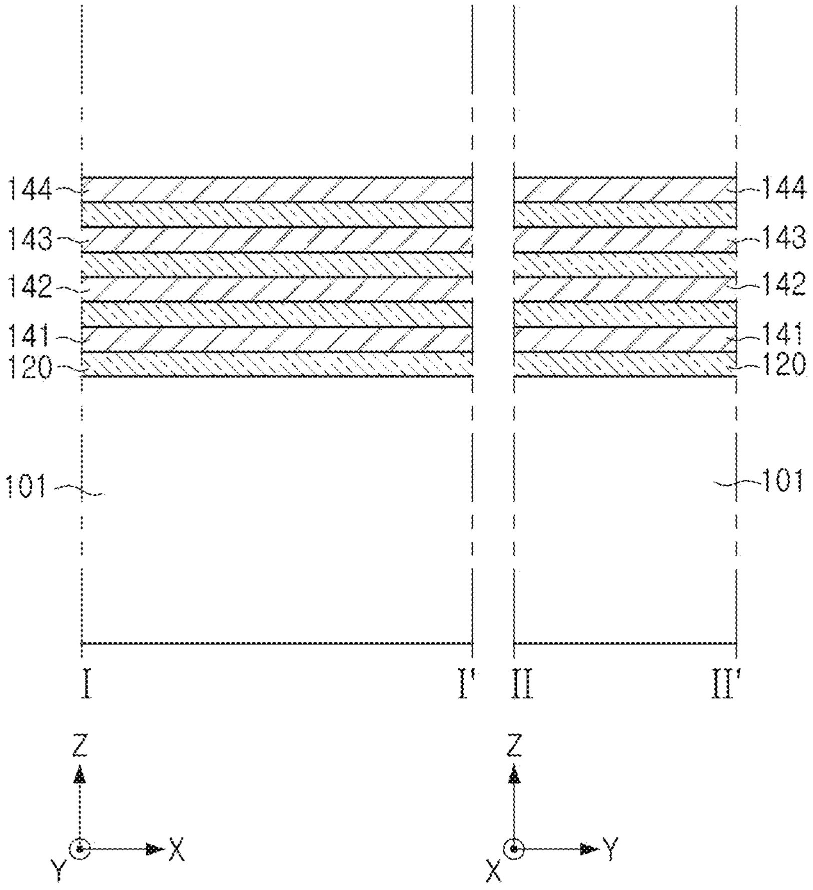
FIGS. 9A to 9L are views illustrating a method of manufacturing a semiconductor device according to some example embodiments, in a process sequence.

Referring to FIG. 9A, sacrificial layers 120 and first to fourth channel layers 141, 142, 143, and 144 may be alternately stacked on a substrate 101.

The substrate 101 may include silicon (Si), germanium (Ge), or silicon germanium (SiGe). The substrate 101 may include a bulk wafer, an epitaxial layer, a silicon-on-insulator (SOI) layer, or a semiconductor-on-insulator (SeOI) layer.

The sacrificial layers 120 may be replaced with gate dielectric layers 162 and gate electrodes 165 below the fourth channel layer 144 by a subsequent process, as illustrated in FIG. 2. The sacrificial layers 120 may be formed of a material having etch selectivity with respect to the first to fourth channel layers 141, 142, 143, and 144, respectively. The first to fourth channel layers 141, 142, 143, and 144 may include a material, different from that of the sacrificial layers 120. The sacrificial layers 120 and the first to fourth channel layers 141, 142, 143, and 144 may include, for example, a semiconductor material including at least one of silicon (Si), silicon germanium (SiGe), or germanium (Ge), but may include different materials, and may or may not include impurities. For example, the sacrificial layers 120 may include silicon germanium (SiGe), and the first to fourth channel layers 141, 142, 143, and 144 may include silicon (Si).

The sacrificial layers 120 and the first to fourth channel layers 141, 142, 143, and 144 may be formed by performing an epitaxial growth process on the stacked structure. The number of channel layers alternately stacked with the sacrificial layers 120 may be variously changed in various example embodiments. A thickness of the sacrificial layers 120 may be constant or may be variable. A thickness of the first to fourth channel layers 141, 142, 143 may be constant or may be variable.

Figure 9B:
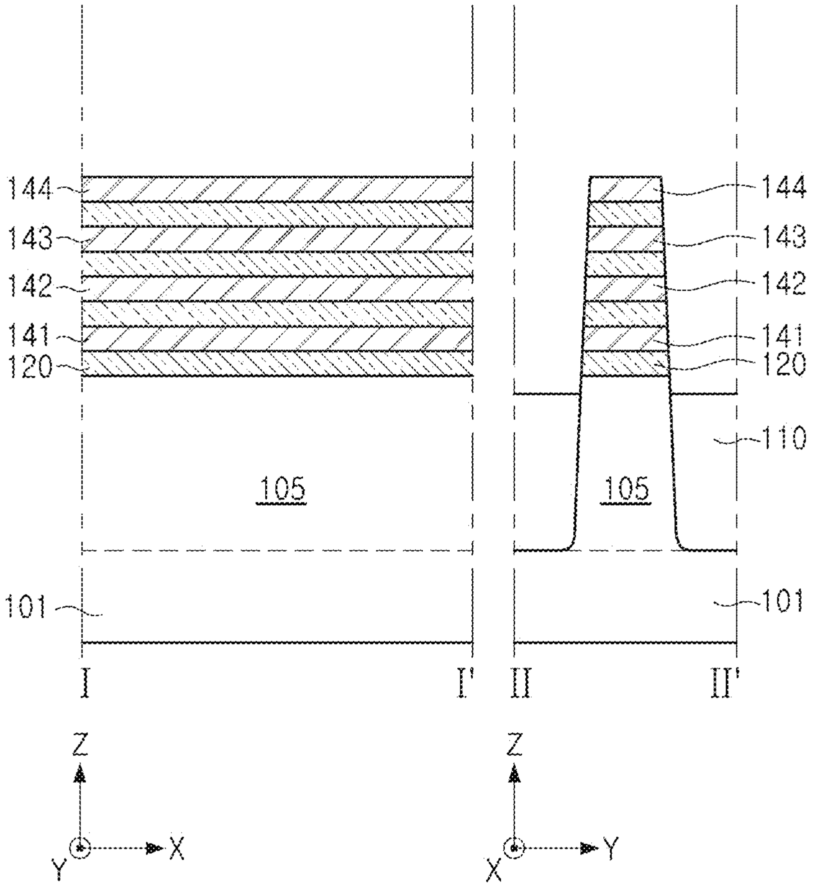

Referring to FIG. 9B, an active structure including an active region 105 by partially removing the sacrificial layers 120, the first to fourth channel layers 141, 142, 143, and 144, and the substrate 101, may be formed, and a device isolation layer 110 may be formed.

The active structure may include the active region 105, the sacrificial layers 120, and the first to fourth channel layers 141, 142, 143, and 144. The active structure may be formed in a linear shape extending in one direction, for example, the X-direction, and may be formed spaced apart from each other in the Y-direction. Side surfaces of the active structure in the Y-direction may be coplanar with each other, and may be located on a straight line.

After filling with an insulating material a region from which a portion of the active region 105, portions of the sacrificial layers 120, and a portion of each of the first to fourth channel layers 141, 142, 143, and 144 are removed, the insulating material may partially be removed such that the active region protrudes, thereby forming the device isolation layer 110. An upper surface of the device isolation layer 110 may be formed lower than an upper surface of the active region 105.

Figure 9C:
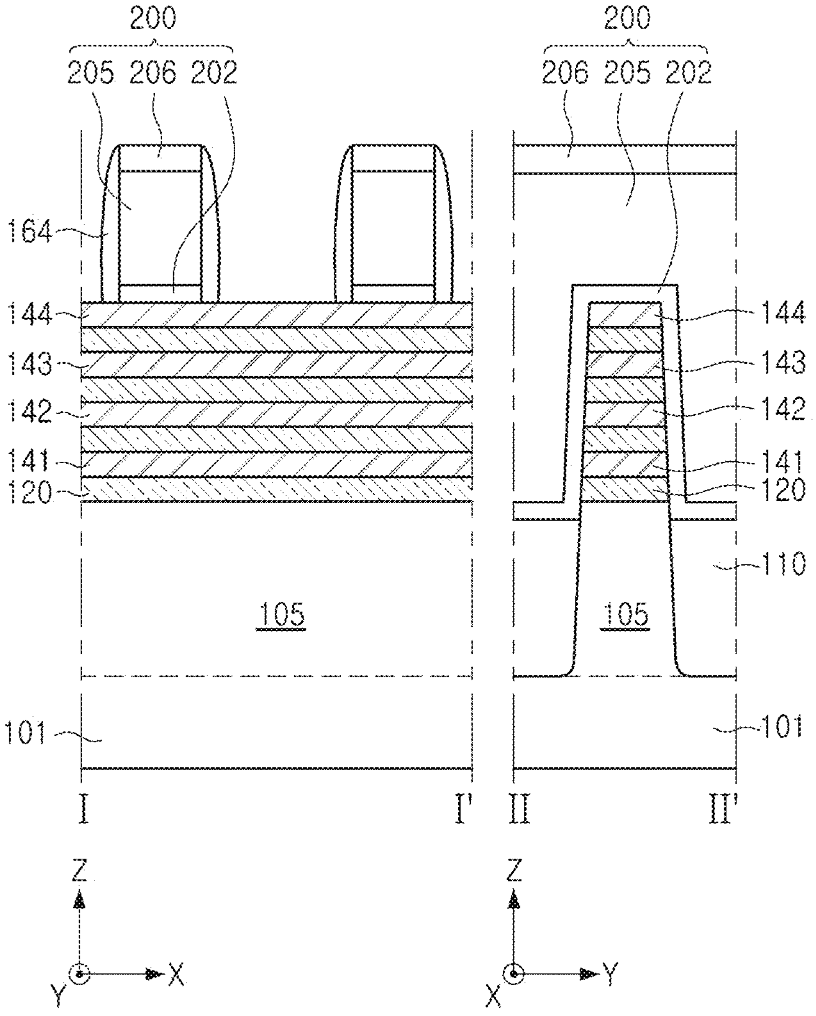

Referring to FIG. 9C, sacrificial gate structures 200 and gate spacer layers 164 may be formed on the active structure.

A sacrificial gate structure 200 may be a sacrificial structure formed in a region in which the gate dielectric layer 162 and the gate electrode 165 are disposed on the channel structures 140 by a subsequent process, as illustrated in FIG. 2. The sacrificial gate structure 200 may have a linear shape extending in one direction intersecting the active structure. The sacrificial gate structures 200 may extend in the Y-direction, and may be spaced apart from each other in the X-direction.

The sacrificial gate structure 200 may include first and second sacrificial gate layers 202 and 205 and a mask pattern layer 206, sequentially stacked. The first and second sacrificial gate layers 202 and 205 may be patterned using the mask pattern layer 206. The first and second sacrificial gate layers 202 and 205 may be an insulating layer and a conductive layer, respectively, but are not limited thereto, and the first and second sacrificial gate layers 202 and 205 may be formed as a single layer. For example, the first sacrificial gate layer 202 may include silicon oxide, and the second sacrificial gate layer 205 may include polysilicon. The mask pattern layer 206 may include silicon oxide and/or silicon nitride.

Gate spacer layers 164 may be formed on both sidewalls of the sacrificial gate structures 200. The gate spacer layers 164 may be formed of a low-κ material, and may include, for example, at least one of SiO, SiN, SiCN, SiOC, SiON, or SiOCN.

Figure 9D:
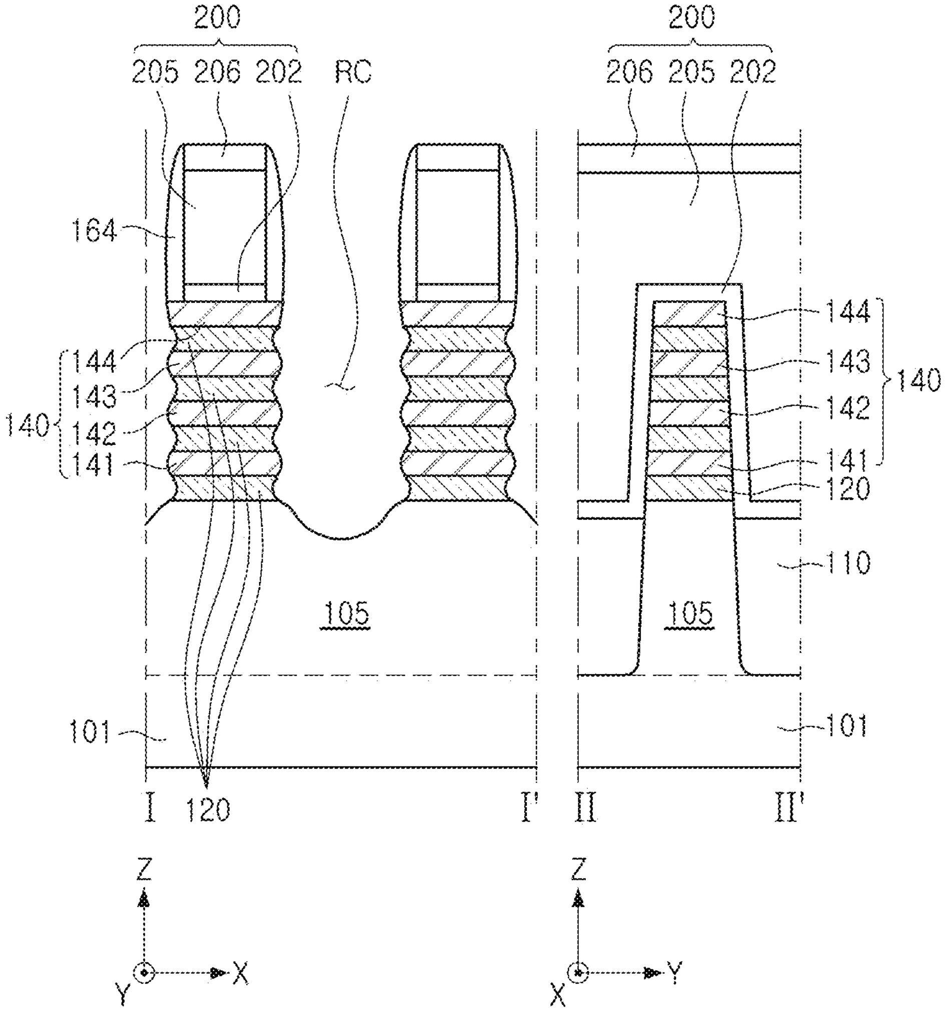

Referring to FIG. 9D, the sacrificial layers 120 and the first to fourth channel layers 141, 142, 143, and 144, exposed from the sacrificial gate structures 200, may be partially removed to form recess regions RC, and the sacrificial layers 120 may be partially removed. The recess regions RC may be formed with a wet etch process; however, example embodiments are not limited thereto.

The recess regions RC may be formed by removing an exposed portion of the sacrificial layers 120 and exposed portions of the first to fourth channel layers 141, 142, 143, and 144 using the sacrificial gate structures 200 and the gate spacer layers 164 as masks. Therefore, the first to fourth channel layers 141, 142, 143, and 144 may form channel structures 140 having a limited length in the X-direction.

The sacrificial layers 120 may be selectively etched with respect to the channel structures 140 by, for example, an isotropic process such as a wet etching process, and may be laterally removed to a predetermined depth in the X-direction. The sacrificial layers 120 may have side surfaces that may be concave inward due to the lateral etching as described above. The specific shapes of the side surfaces of the sacrificial layers 120 are not limited to those illustrated in FIG. 9D.

Figure 9E:
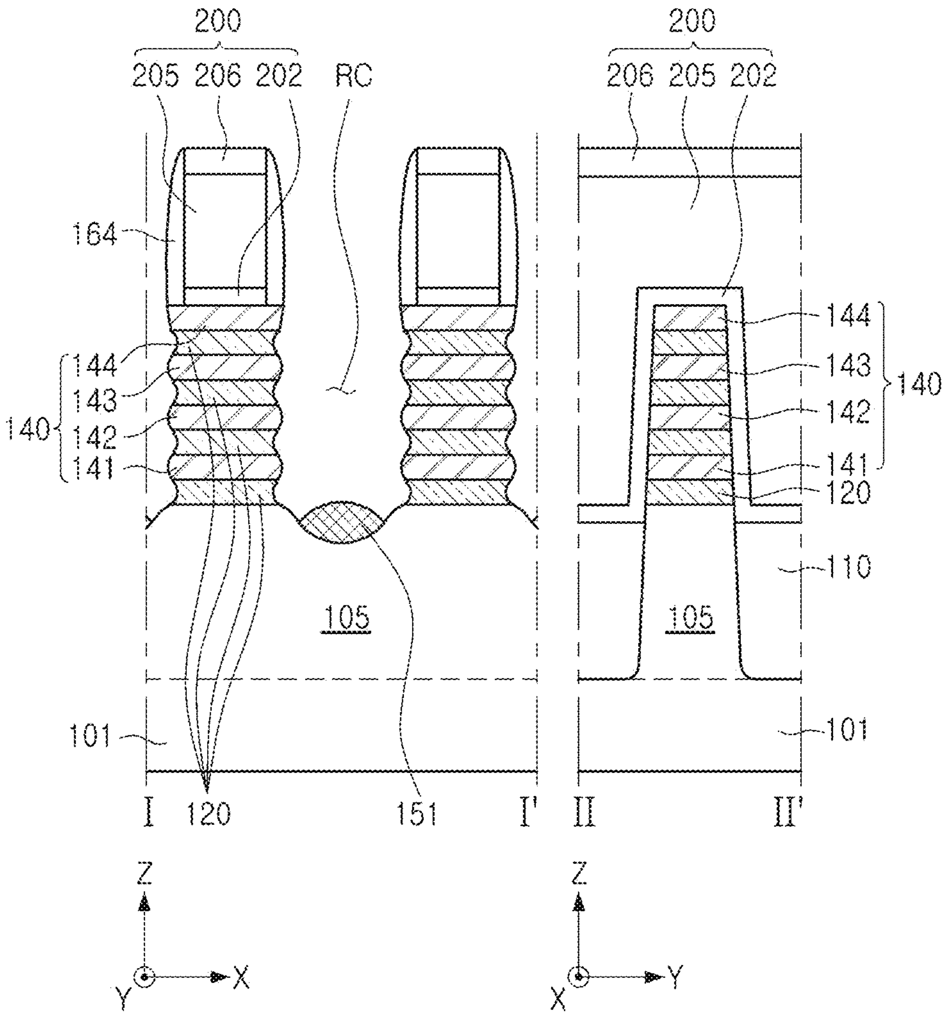

Referring to FIG. 9E, sacrificial epitaxial layers 151 may be formed in the recess regions RC.

A sacrificial epitaxial layer 151 may be formed by growing from the active region 105 exposed from a bottom surface of a recess region RC by, for example, a selective epitaxial process. The selective epitaxial growth process may include a chemical vapor deposition (CVD) process including a silane ($SiH_4$) process and/or a germane ($GeH_4$) process; however, example embodiments are not limited thereto. The sacrificial epitaxial layer 151 may have a composition different from that of the subsequently formed source/drain regions 150. For example, the sacrificial epitaxial layer 151 may include germanium (Ge) having a relatively higher concentration than a source/drain region 150 to be formed subsequently. The sacrificial epitaxial layer 151 may be spaced apart from the sacrificial layers 120 and the first to fourth channel layers 141, 142, 143, and 144. In some embodiments, a relative thickness of the sacrificial epitaxial layer 151 may be variously changed within a range in which the sacrificial epitaxial layer 151 is spaced apart from the sacrificial layers 120 and the first to fourth channel layers 141, 142, 143, and 144.

Figure 9F:
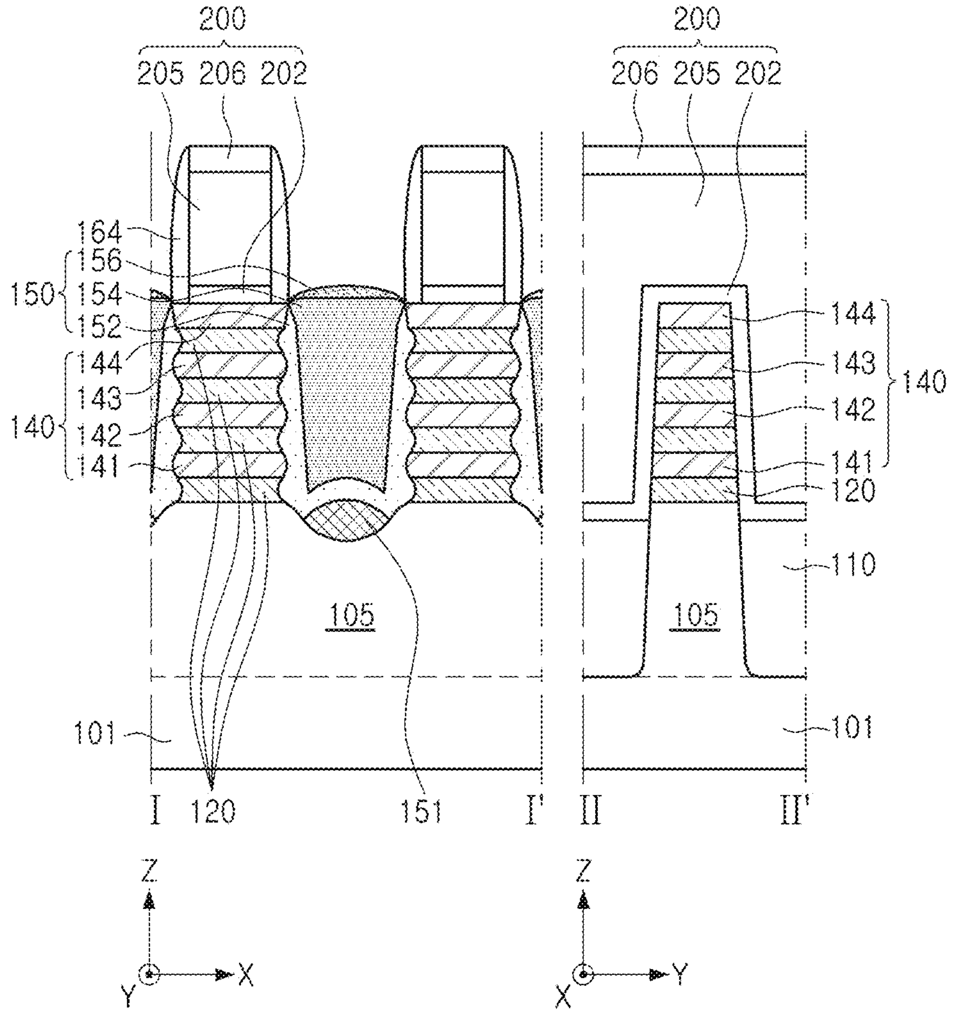

Referring to FIG. 9F, source/drain regions 150 may be formed to fill the recess regions RC.

The source/drain region 150 may be grown and formed from the upper surface of the active region 105, an upper surface of the sacrificial epitaxial layer 151, and side surfaces of the channel structure 140, for example, by a selective epitaxial process. First to third epitaxial layers 152, 154, and 156 constituting or included in the source/drain region 150 may be sequentially formed. The first to third epitaxial layers 152, 154, and 156 may include impurities by in-situ doping and/or ion implantation, and may have different compositions and/or doping concentrations. In some example embodiments, the first to third epitaxial layers 152, 154, and 156 may be formed in one process chamber, e.g., without a loss of vacuum in a process chamber; however, example embodiments are not limited thereto.

Figure 9G:
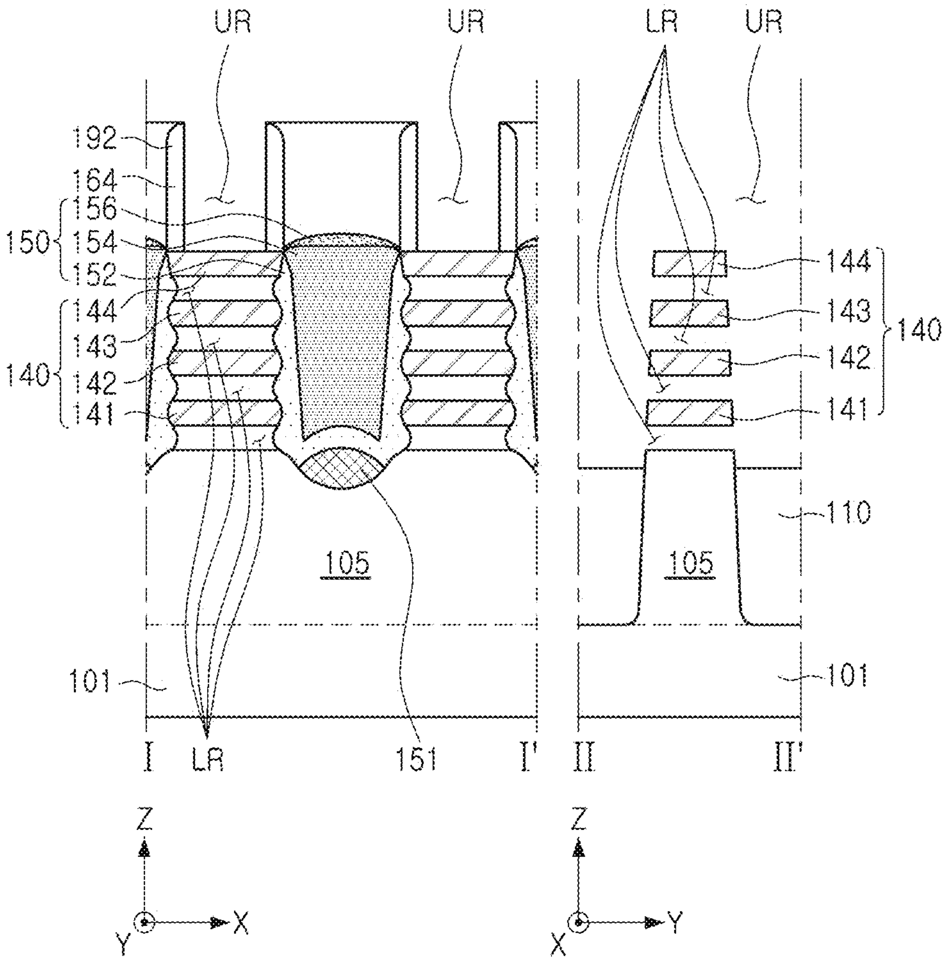

Referring to FIG. 9G, a first interlayer insulating layer 192 may be partially formed, and the sacrificial gate structures 200 and the sacrificial layers 120 may be removed.

The first interlayer insulating layer 192 may be prepared by forming an insulating film covering the sacrificial gate structures 200 and the source/drain regions 150 and performing a planarization process.

The sacrificial gate structures 200 and the sacrificial layers 120 may be selectively removed with respect to the gate spacer layers 164, the first interlayer insulating layer 192, and the channel structures 140. First, the sacrificial gate structures 200 may be removed to form upper gap regions UR, and then the sacrificial layers 120 exposed through the upper gap regions UR may be removed to form lower gap regions LR.

For example, when the sacrificial layers 120 include silicon germanium (SiGe) and the channel structures 140 include silicon (Si), the sacrificial layers 120 may be wet-etched to be selectively removed with respect to the channel structures 140. For example, when the sacrificial layers 120 include a first relatively high concentration of germanium (Ge), and the first epitaxial layer 152 include a second relatively low concentration of germanium (Ge), the sacrificial layers 120 may be selectively removed with respect to the first epitaxial layer 152.

Figure 9H:
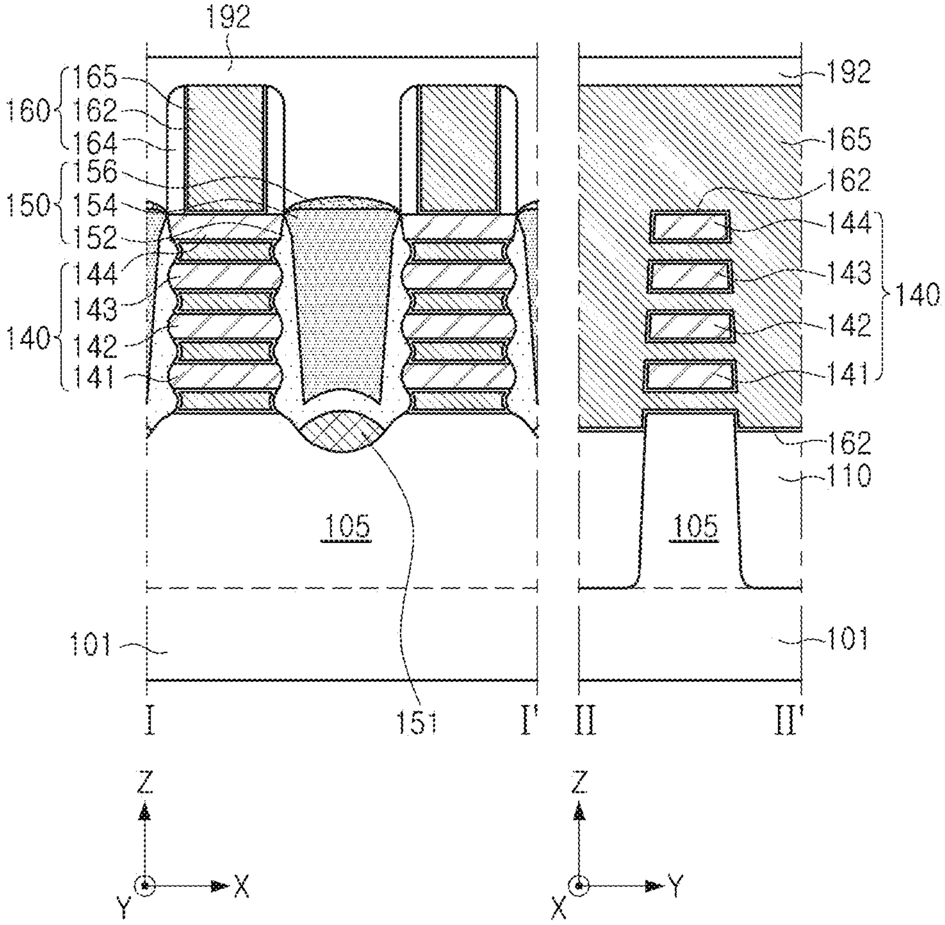

Referring to FIG. 9H, gate structures 160 may be formed by forming gate dielectric layers 162 and a gate electrode 165.

The gate dielectric layers 162 and the gate electrode 165 may be formed to fill the upper gap regions UR and the lower gap regions LR. The gate dielectric layers 162 may be formed to conformally cover internal surfaces of the upper gap regions UR and internal surfaces of the lower gap regions LR. After the gate electrode 165 is formed to completely fill the upper gap regions UR and lower gap regions LR, the upper gap regions UR may be removed to a certain depth from the top.

After that the formation of the gate dielectric layers 162, a first interlayer insulating layer 192 may be further formed on the gate structures 160.

Figure 9I:
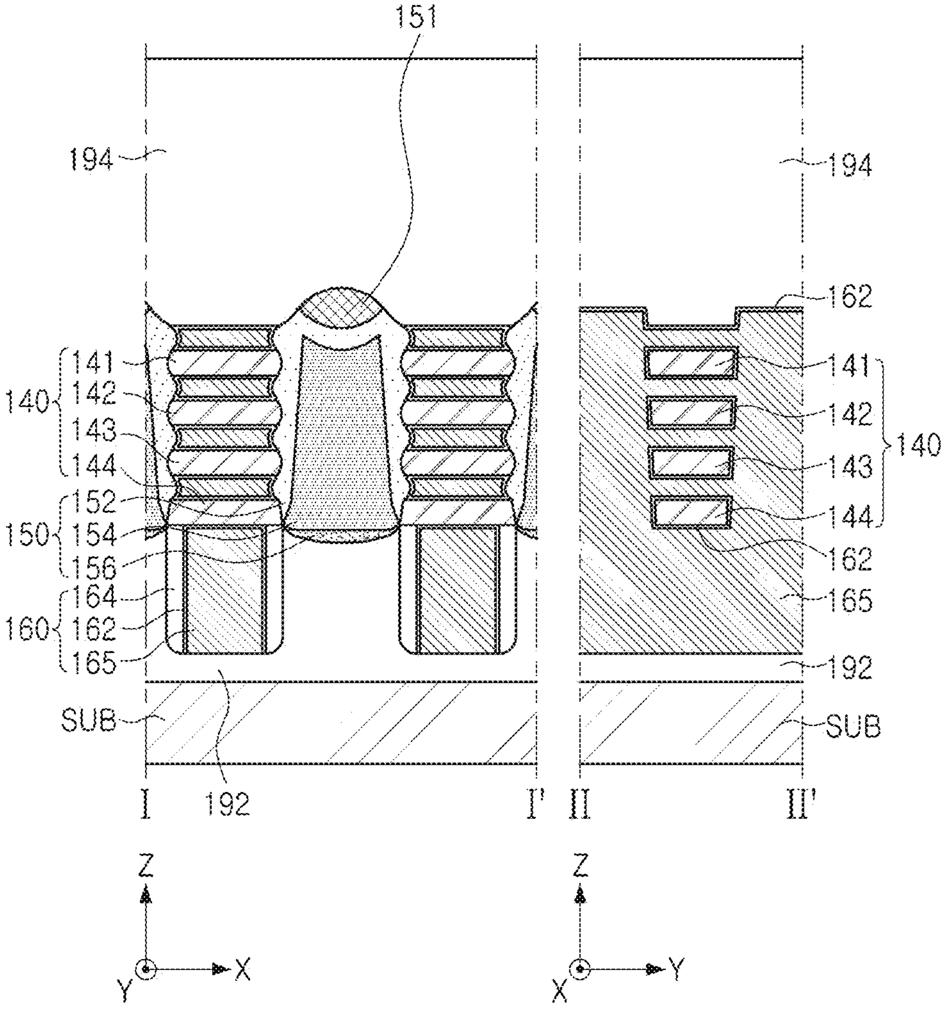

Referring to FIG. 9I, an entire structure formed with reference to FIGS. 9A to 9H may be attached to a carrier substrate SUB, the substrate 101 may be removed, and a substrate insulating layer 194 may be formed.

First, although not specifically illustrated, contact plugs and interconnection lines connected to the gate structures 160 may be further formed on the gate structures 160. To perform a process on a lower surface of the substrate 101 in FIG. 9H, the carrier substrate SUB may be attached to the first interlayer insulating layer 192. In the following drawings, for ease of understanding, the entire structure is illustrated as being rotated or reversed to form a mirror image of the structure illustrated in FIG. 9H.

The substrate 101 may be removed from an upper surface of the substrate 101. The substrate 101 may be removed and thinned by, for example, one or more of a lapping process, a grinding process, or a polishing process, and a remaining region may also be removed by an etching process and/or an oxidation process. A thickness from which the substrate 101 is removed may be variously changed in various example embodiments. In some example embodiments, the substrate 101 may not be completely removed, and a portion thereof may remain. In this case, the active regions 105 may remain on upper surfaces of the gate structures 160.

The substrate insulating layer 194 may be formed in a region from which the substrate 101 is removed. When a portion of the device isolation layer 110 remains without being removed along with the substrate 101, the substrate insulating layer 194 may include the remaining device isolation layer 110.

Figure 9J:
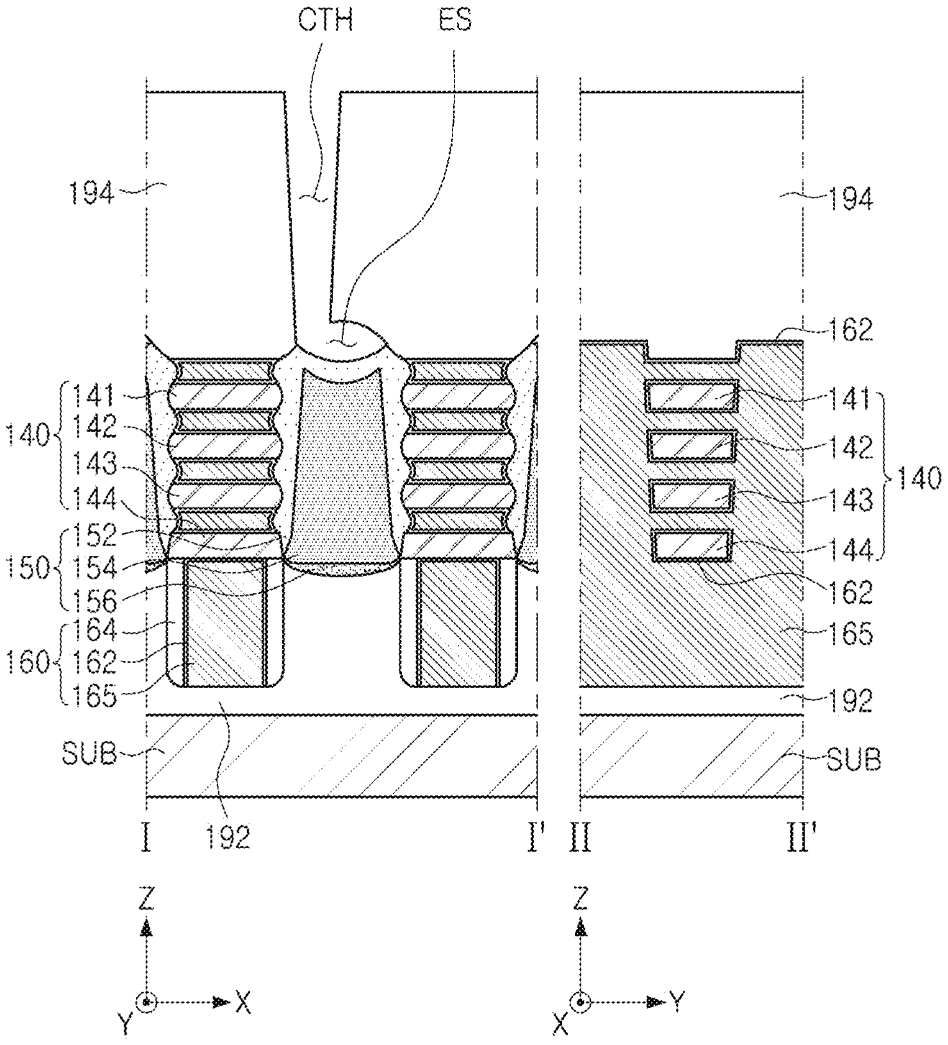

Referring to FIG. 9J, a contact hole CTH may be formed, and the sacrificial epitaxial layer 151 may be removed.

The contact hole CTH may be formed to pass through the substrate insulating layer 194, along the vertical region VR of the backside contact plug 180 of FIGS. 2 and 3. The sacrificial epitaxial layer 151 may be exposed through the contact hole CTH. The exposed sacrificial epitaxial layer 151 may be selectively removed by an etching process. Therefore, an expansion part ES may be formed below the contact hole CTH.

In this operation, when forming the contact hole CTH, the contact hole CTH may be offset without being accurately aligned with the source/drain region 150. Even in this case, as the sacrificial epitaxial layer 151 may be selectively removed, a region of the source/drain area 150 exposed through the expansion part ES may be closer to a center of the source/drain area 150, and a surface area of the source/drain region 150 to be exposed may be secured.

Figure 9K:
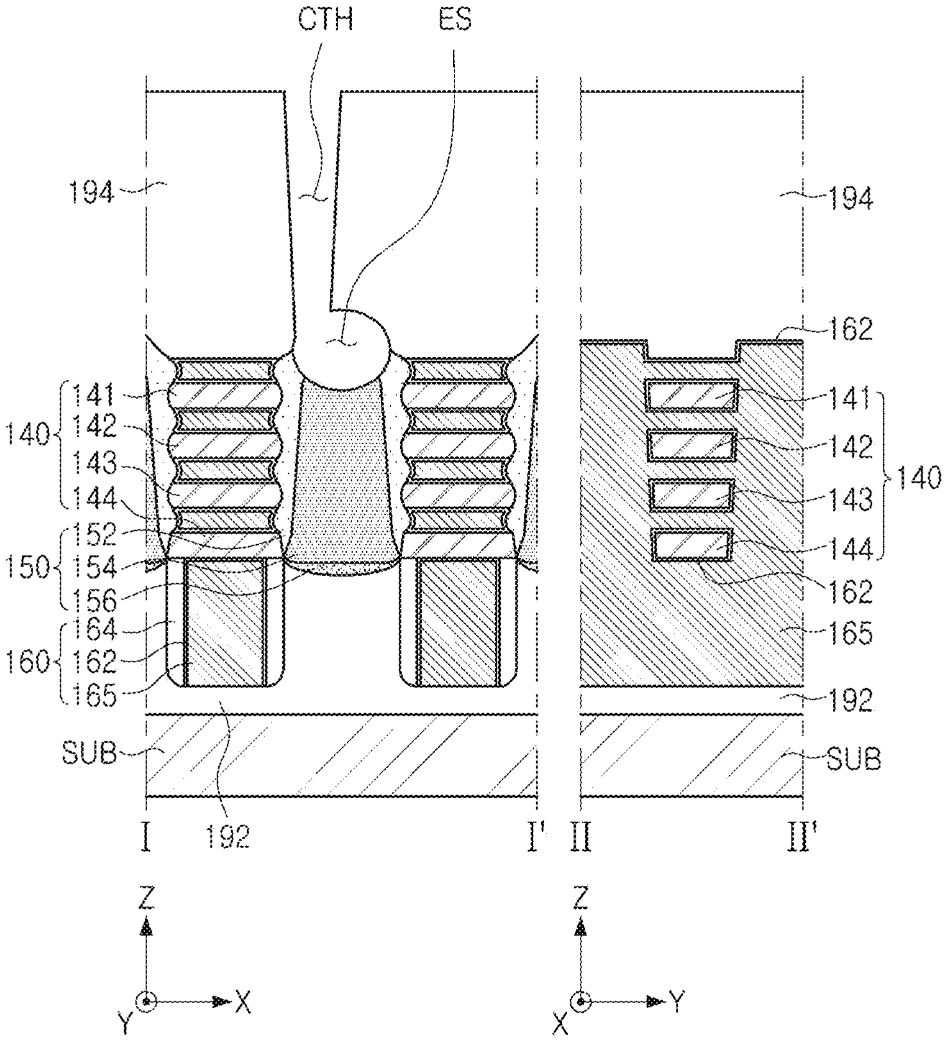

Referring to FIG. 9K, an exposed portion of the first epitaxial layer 152 may be removed.

The second epitaxial layer 154 may be exposed by partially removing the first epitaxial layer 152 exposed below the contact hole CTH. Therefore, the expansion part ES below the contact hole CTH may be further expanded to correspond to the contact region CR of FIG. 3. This operation may be continuously performed with the removing the sacrificial epitaxial layer 151 described above with reference to FIG. 9J, but is not limited thereto.

Figure 9L:
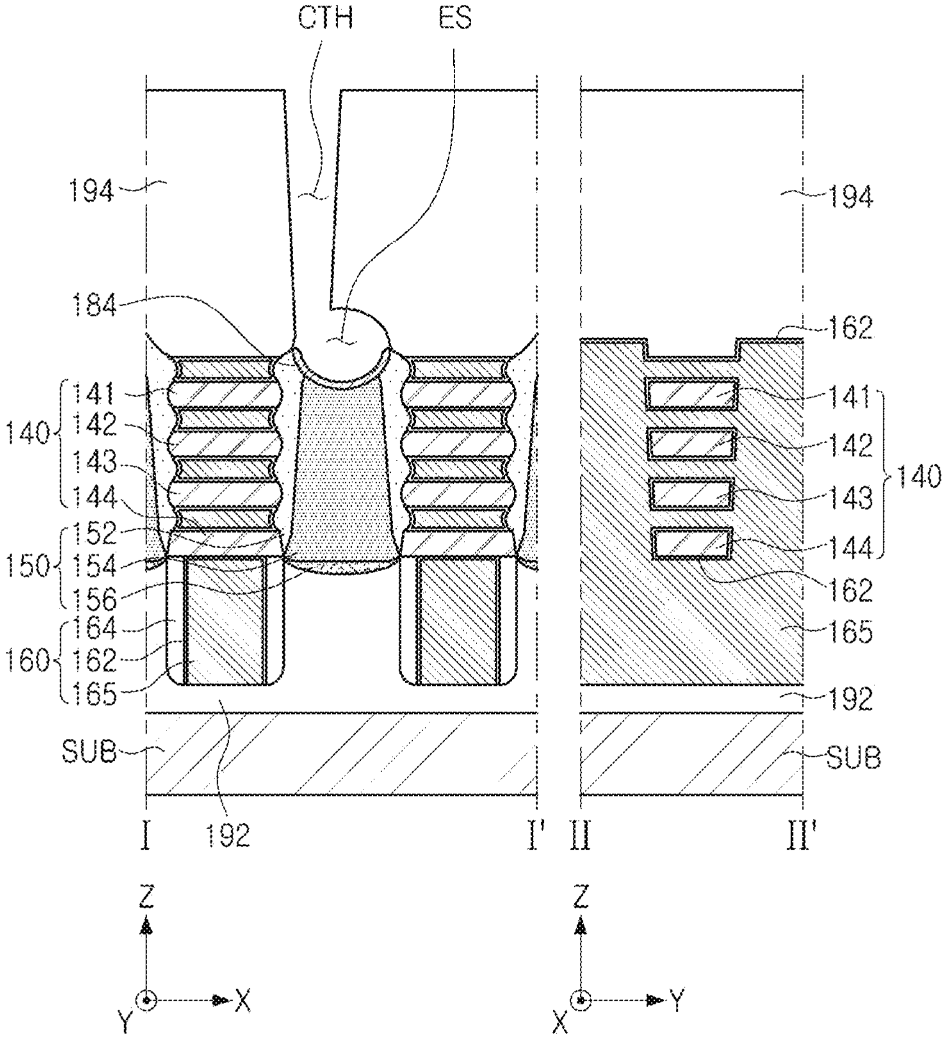

Referring to FIG. 9L, a metal-semiconductor compound layer 184 may be formed.

The metal-semiconductor compound layer 184 may be formed by performing a metal-semiconductor conversion process, such as a silicidation process and/or the like, using the source/drain regions 150 exposed through the expansion part ES.

Next, referring to FIG. 2 together, after preparing a backside contact plug 180 by forming, e.g., conformally forming, a liner layer 182 and a conductive layer 186, a backside power structure 195 may be formed.

The liner layer 182 may be formed on an exposed surface of the substrate insulating layer 194, and the conductive layer 186 may be formed to fill the contact hole CTH and the expansion part ES. Therefore, the backside contact plug 180 including the liner layer 182, the metal-semiconductor compound layer 184, and the conductive layer 186 may be formed.

Next, after forming a second interlayer insulating layer 196, a portion of the second interlayer insulating layer 196 may be removed to form the backside power structure 195, and the carrier substrate SUB may be removed.

As a result, the semiconductor device 100 of FIGS. 1 to 3 may be manufactured. The semiconductor device 100 may be packaged in a state in which the backside power structure 195 is located thereon, but is not limited thereto.

Figure 10A:
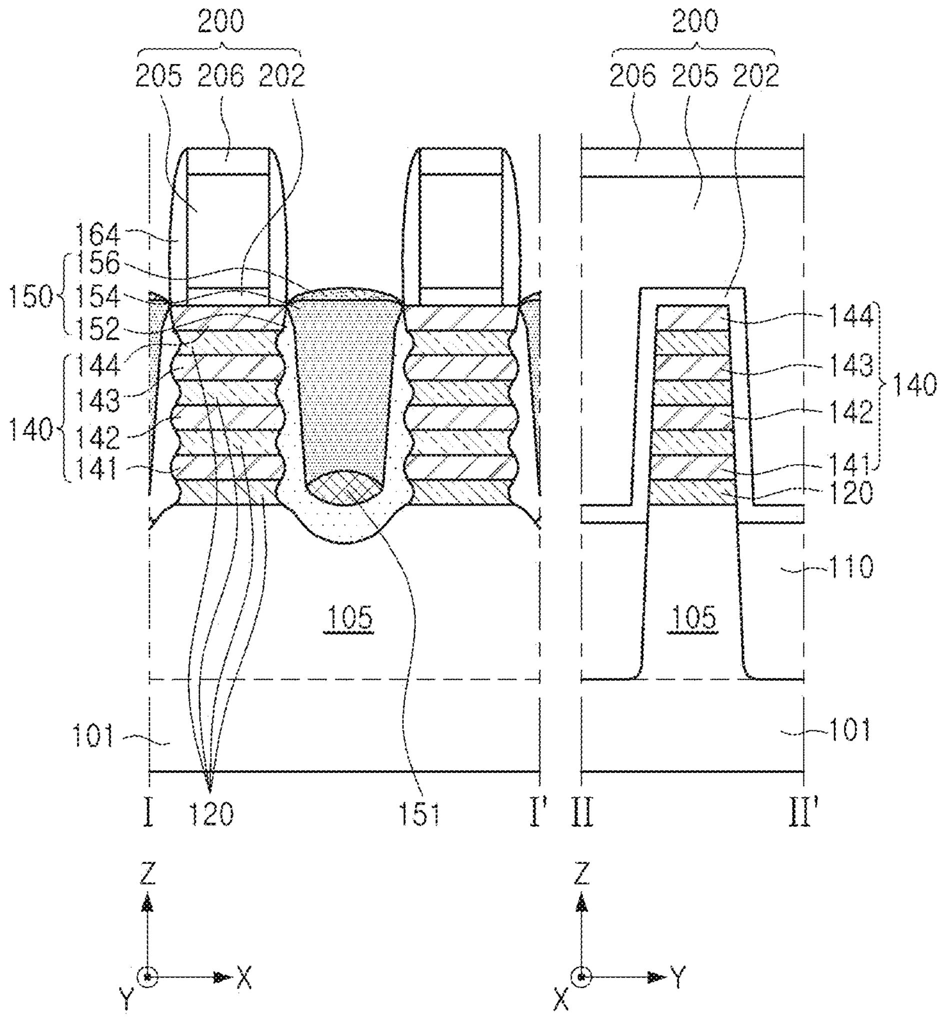
FIGS. 10A to 10C are views illustrating a method of manufacturing a semiconductor device according to some example embodiments, in a process sequence.
Figure 10B:
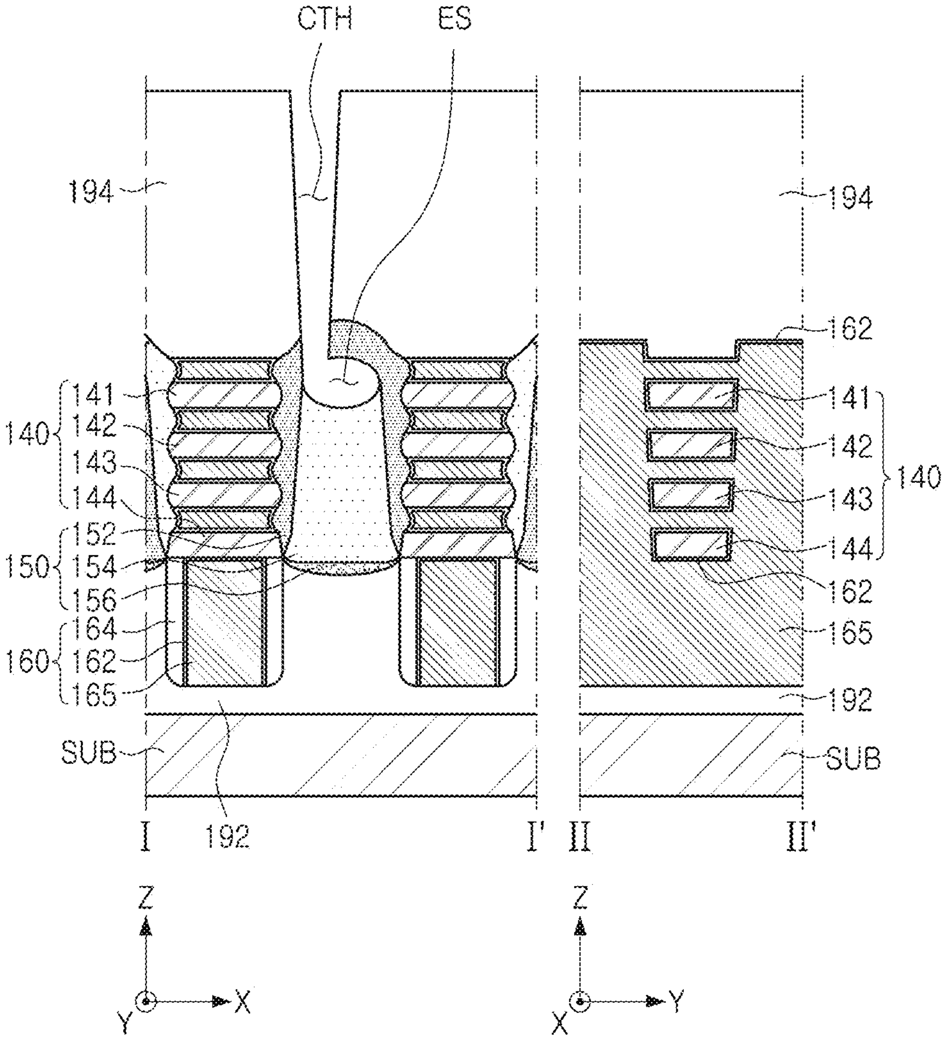
Figure 10C:
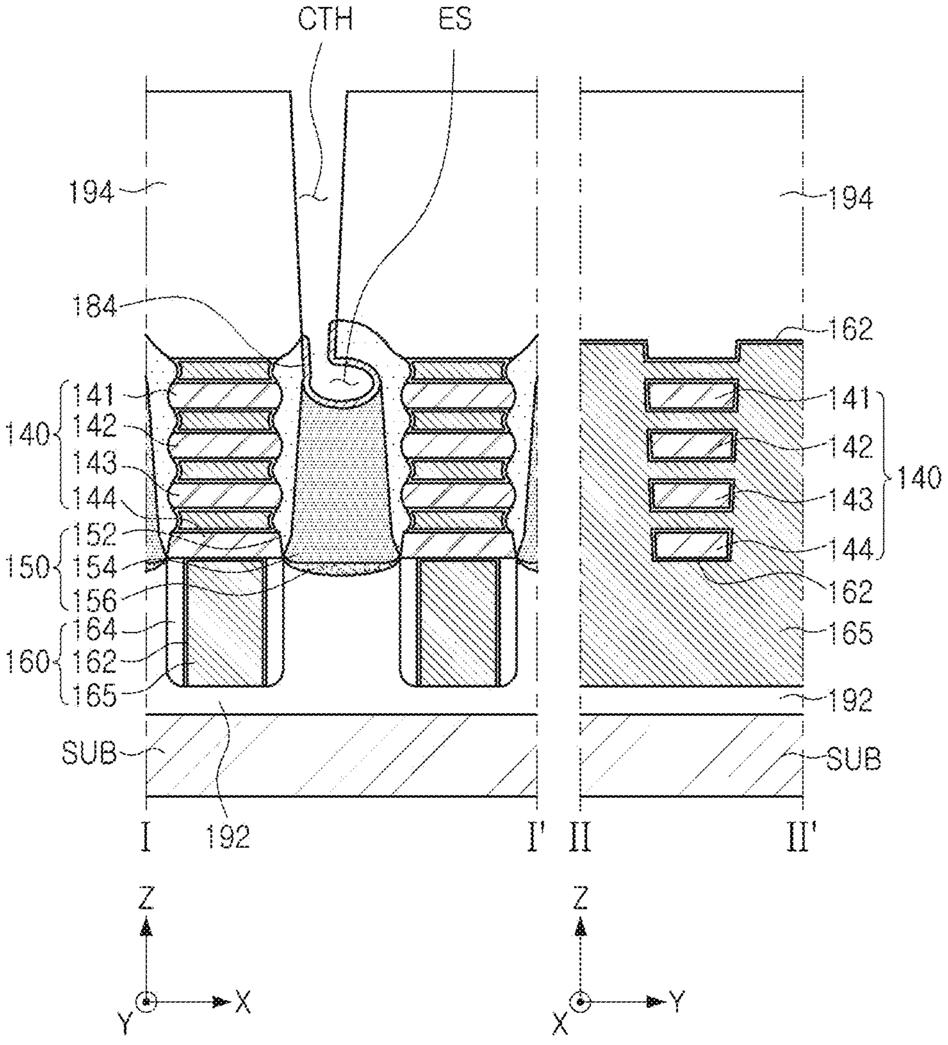

FIGS. 10A to 10C are views illustrating a method of manufacturing a semiconductor device according to some example embodiments, in a process sequence. FIGS. 10A to 10C illustrate cross-sections corresponding to FIG. 4A.

Referring to FIG. 10A, after the operations described above with reference to FIGS. 9A to 9D are performed in the same manner, sacrificial epitaxial layers 151 and source/drain regions 150 may be formed in recess regions RC.

After forming a first epitaxial layer 152, the sacrificial epitaxial layers 151 may be formed on a central region of the first epitaxial layer 152. Second and third epitaxial layers 154 and 156 may be sequentially formed on the sacrificial epitaxial layers 151.

Referring to FIG. 10B, after the operations described above with reference to FIGS. 9G to 9I are performed in the same manner, a contact hole CTH may be formed, and the sacrificial epitaxial layer 151 may be removed.

The contact hole CTH in various example embodiments may be formed to pass through the substrate insulating layer 194 and the first epitaxial layer 152, along the vertical region VR of the backside contact plug 180*a* of FIGS. 4A and 4B. The sacrificial epitaxial layer 151 may be exposed through the contact hole CTH.

The exposed sacrificial epitaxial layer 151 may be removed by an etching process. Therefore, an expansion part ES may be formed below the contact hole CTH, and the second epitaxial layer 154 may be exposed through the expansion part ES. The expansion part ES may correspond to the contact region CR of FIG. 4B. When the sacrificial epitaxial layer 151 is removed, a portion of the second epitaxial layer 154 may also be removed together, but is not limited thereto.

Referring to FIG. 10C, a metal-semiconductor compound layer 184 may be formed.

The metal-semiconductor compound layer 184 may be formed by performing a metal-semiconductor conversion process using the source/drain region 150 exposed through the extension ES.

Next, referring back to FIG. 4A, after forming the backside contact plug 180*a* by forming the liner layer 182 and the conductive layer 186, a backside power structure 195 may be formed. As a result, the semiconductor device 100*a* of FIGS. 4A and 4B may be manufactured.

A backside contact plug may be aligned to a source/drain region using a sacrificial epitaxial layer, to minimize contact resistance, thereby providing provide a semiconductor device having improved reliability.

Various advantages and/or effects of example embodiments are not limited to the above, and will be more easily understood in the process of describing various example embodiments of inventive concepts.

While some example embodiments have been illustrated and described above, it will be apparent to those of ordinary skill in the art that modifications and variations could be made without departing from the scope of inventive concepts as defined by the appended claims. Furthermore, example embodiments are not necessarily mutually exclusive with one another. For example, some example embodiments may include one or more features described with reference to one or more figures, and may also include one or more other features described with reference to one or more other figures.

What is claimed is:

1. A semiconductor device comprising:

a substrate insulating layer;

a gate structure extending in one direction on the substrate insulating layer;

a source/drain region outside of the gate structure; and a backside contact plug below the source/drain region and having a second central axis offset in a horizontal direction from a first central axis of the source/drain region, and connected to the source/drain region, wherein, the source/drain region includes a first epitaxial layer and a second epitaxial layer, the first epitaxial layer including a first non-silicon element at a first concentration, and the second epitaxial layer on the first epitaxial layer and including a second non-silicon element at a second concentration, greater than the first concentration, and at least a portion of an upper surface of the backside contact plug is in contact with the second epitaxial layer, wherein the backside contact plug comprises a vertical region extending vertically and having a first width, and a contact region on the vertical region and having a second width, wider than the first width, and wherein the vertical region is below the source/drain region, and at least a portion of a surface of the contact region is in contact with the first epitaxial laver.

2. The semiconductor device of claim 1, wherein the backside contact plug passes through the first epitaxial layer in a lower portion of the source/drain region and is in contact with the first epitaxial layer.

3. The semiconductor device of claim 1, wherein a third central axis of the vertical region is offset from a fourth central axis of the contact region in the horizontal direction.

4. The semiconductor device of claim 1, wherein the backside contact plug comprises a metal-semiconductor compound layer corresponding to the upper surface of the backside contact plug.

5. The semiconductor device of claim 1, wherein a horizontal distance between the first central axis and the second central axis ranges from about 0.5 nm to about 20 nm.

6. The semiconductor device of claim 1, wherein at least one of the first non-silicon element or the second non-silicon element is independently at least one of germanium (Ge) or a doping element.

7. The semiconductor device of claim 1, further comprising:

an additional source/drain region spaced apart from the source/drain region and not having a contact plug disposed therebelow, wherein the additional source/drain region further includes a sacrificial epitaxial layer in a lower portion of the additional source/drain region.

8. The semiconductor device of claim 7, wherein the sacrificial epitaxial layer comprises a third non-silicon element in a third concentration, greater than the first concentration and the second concentration.

9. The semiconductor device of claim 1, further comprising:

a backside power structure below the backside contact plug, connected to the backside contact plug, and configured to apply power to the source/drain region.

10. The semiconductor device of claim 1, further comprising:

a plurality of channel layers on the substrate insulating layer, spaced apart from each other in a vertical direction, and surrounded by the gate structure.

11. A semiconductor device comprising:

a gate structure extending in one direction;

a source/drain region outside of the gate structure; and a backside contact plug below the source/drain region, having a second central axis offset in a horizontal direction from a first central axis of the source/drain region, and connected to the source/drain region, wherein the backside contact plug includes a vertical region and a contact region, the vertical region extending vertically and having a first width, and the contact region on the vertical region and having a second width, wider than the first width, wherein a lower end of the contact region is above a lower end of the source/drain region.

12. The semiconductor device of claim 11, wherein the vertical region has a side surface inclined to decrease in width toward the source/drain region, and the contact region has a shape expanding from the vertical region.

13. The semiconductor device of claim 11, wherein an upper end of the backside contact plug is above a lower end of the source/drain region.

14. A semiconductor device comprising:

a gate structure extending in one direction;

a source/drain region outside of the gate structure; and a backside contact plug below the source/drain region and connected to the source/drain region, wherein, the backside contact plug includes a vertical region and a contact region, the vertical region extending vertically and having a first width, and the contact region on the vertical region and having a second width, wider than the first width, and a second central axis of the vertical region is offset in a horizontal direction from a first central axis of the contact region, wherein a third central axis of the source/drain region is offset in the horizontal direction from the second central axis of the vertical region.

* * * * *